United States Patent
Shimojo

(10) Patent No.: US 12,211,913 B2
(45) Date of Patent: Jan. 28, 2025

(54) SEMICONDUCTOR STORAGE DEVICE WITH IMPROVED CUTOFF CHARACTERISTICS

(71) Applicant: KIOXIA CORPORATION, Tokyo (JP)

(72) Inventor: Yoshiro Shimojo, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 601 days.

(21) Appl. No.: 17/409,751

(22) Filed: Aug. 23, 2021

(65) Prior Publication Data

US 2022/0278215 A1    Sep. 1, 2022

(30) Foreign Application Priority Data

Mar. 1, 2021  (JP) .................................. 2021-032020

(51) Int. Cl.
*G11C 16/04* (2006.01)
*H01L 21/28* (2006.01)
(Continued)

(52) U.S. Cl.
CPC .... *H01L 29/42344* (2013.01); *G11C 16/0483* (2013.01); *H01L 23/5283* (2013.01);
(Continued)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50;
(Continued)

(56) References Cited

U.S. PATENT DOCUMENTS

2009/0146206 A1* 6/2009 Fukuzumi .............. H10B 43/20
257/E21.442
2010/0276743 A1* 11/2010 Kuniya ............. H01L 29/66833
257/315

(Continued)

FOREIGN PATENT DOCUMENTS

JP    2019-165089 A    9/2019
JP    2020-038930 A    3/2020

*Primary Examiner* — Didarul A Mazumder
*Assistant Examiner* — Gustavo G Ramallo
(74) *Attorney, Agent, or Firm* — Kim & Stewart LLP

(57) ABSTRACT

A semiconductor storage device includes a first stacked body including first insulating films and first conductive films that are alternately stacked in a first direction. A first columnar body and a second columnar body extend within the first stacked body in the first direction. A second conductive film is provided above the first stacked body, and extends in a third direction intersecting the first direction and the second direction. A third insulator is adjacent to the second conductive film and extends in the third direction. A third conductive film is adjacent to the third insulator and extends in the third direction. A third columnar body is provided on the first columnar body. A fourth columnar body is provided on the second columnar body. A thickness of a third semiconductor portion in the first direction is greater than a thickness of the second conductive film in the first direction.

6 Claims, 18 Drawing Sheets

(51) Int. Cl.
  *H01L 23/528* (2006.01)
  *H01L 29/423* (2006.01)
  *H01L 29/66* (2006.01)
  *H01L 29/792* (2006.01)
  *H10B 43/10* (2023.01)
  *H10B 43/27* (2023.01)
  *H10B 43/35* (2023.01)

(52) U.S. Cl.
  CPC .. *H01L 29/40117* (2019.08); *H01L 29/66833* (2013.01); *H01L 29/792* (2013.01); *H10B 43/10* (2023.02); *H10B 43/27* (2023.02); *H10B 43/35* (2023.02)

(58) Field of Classification Search
  CPC ........ H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
  See application file for complete search history.

(56) References Cited

U.S. PATENT DOCUMENTS

| | | |
|---|---|---|
| 2012/0018796 A1 | 1/2012 | Yahashi et al. |
| 2017/0069650 A1 | 3/2017 | Iinuma |
| 2019/0287994 A1 | 9/2019 | Tanaka et al. |
| 2020/0075621 A1* | 3/2020 | Nakaki ................. H10B 43/35 |
| 2021/0043244 A1* | 2/2021 | Choi ................. G11C 11/4094 |

* cited by examiner

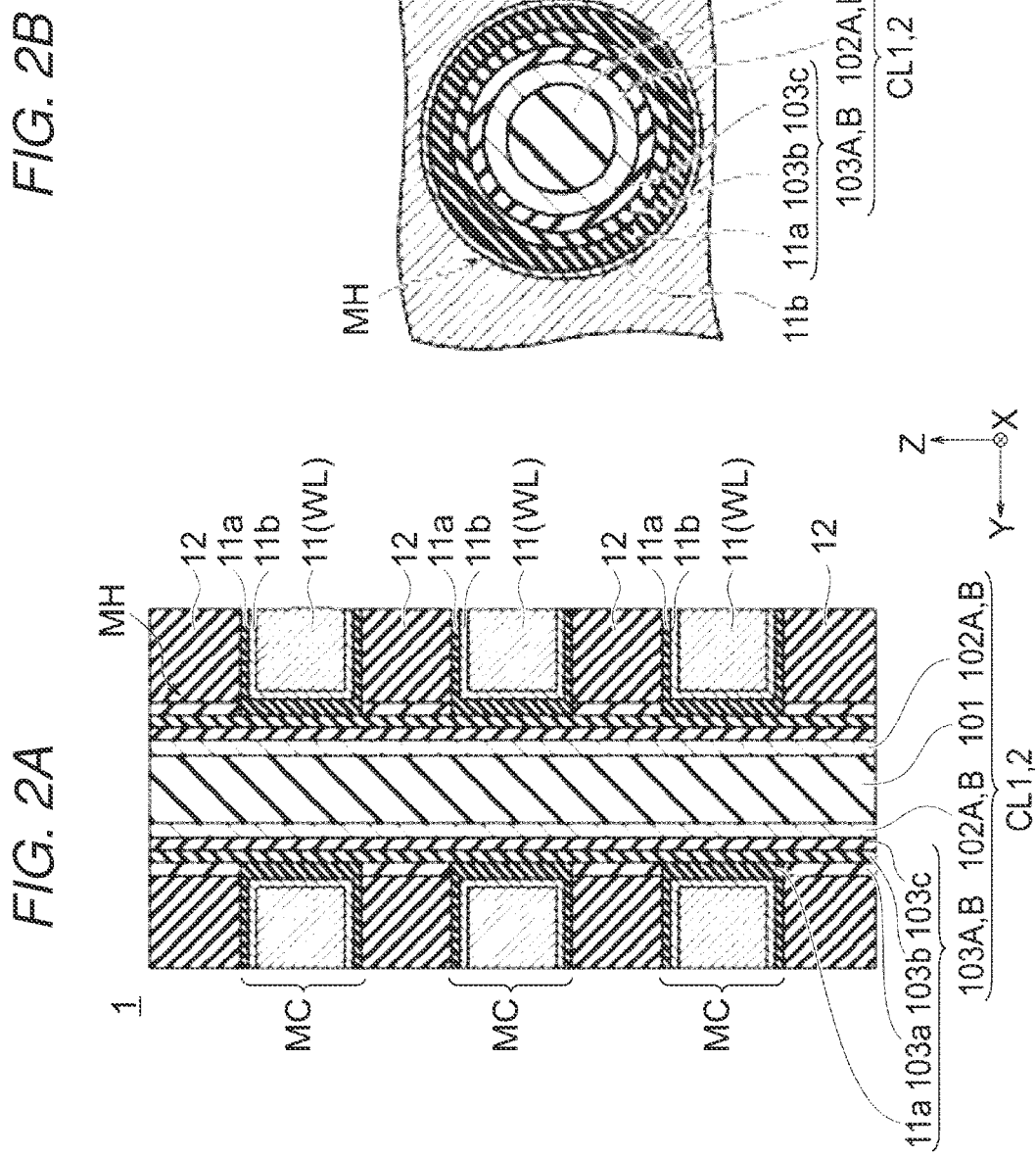

SEMICONDUCTOR STORAGE DEVICE WITH IMPROVED CUTOFF CHARACTERISTICS

CROSS-REFERENCE TO RELATED APPLICATION(S)

This application is based upon and claims the benefit of priority from Japanese Patent Application No. 2021-032020, filed Mar. 1, 2021, the entire contents of which are incorporated herein by reference.

FIELD

Embodiments described herein relate generally to a semiconductor storage device and a manufacturing method of a semiconductor storage device.

BACKGROUND

A semiconductor storage device, such as a NAND flash memory, may have a three-dimensional memory cell array in with a plurality of memory cells are arranged three-dimensionally. A select gate is provided for such a three-dimensional memory cell array to permit selection of a particular memory string.

The select gate may be formed in a columnar semiconductor region provided separately from a memory hole for the memory cells. In this case, a gate electrode of the select gate may be provided in a portion around the columnar semiconductor region. According to such a structure, the channel width of the select gate may become narrow, which may limit a cell current. Furthermore, since the semiconductor region where a gate electrode is not provided is not able to control a voltage, there is a concern of an off-leakage current.

BRIEF DESCRIPTION OF THE DRAWINGS

FIGS. 2A and 2B illustrate respectively schematic cross-sectional views of an example of a memory cell in a three-dimensional structure.

DETAILED DESCRIPTION

Figure 1A:
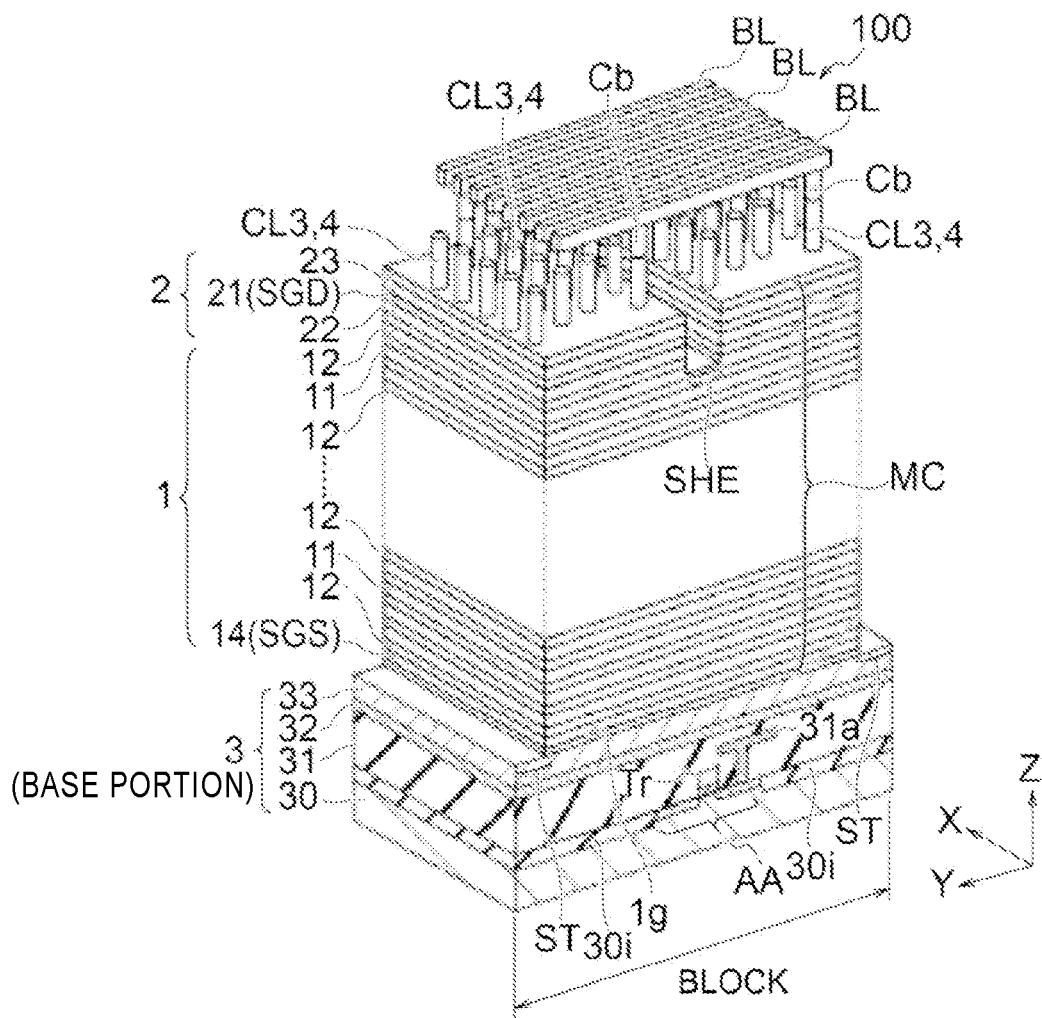
FIG. 1A illustrates a schematic perspective view of an example of a semiconductor storage device according to a first embodiment.

Embodiments provide a semiconductor storage device capable of appropriately controlling a select gate and a manufacturing method for a semiconductor storage device.

In general, according to an embodiment, a semiconductor storage device includes a first stacked body, a first columnar body, and a second columnar body. The first stacked body includes a plurality of first insulating films and a plurality of first conductive films that are alternately stacked in a first direction. The first columnar body extends in the first direction within the first stacked body and includes a first semiconductor portion and a first insulator provided between the first stacked body and the first semiconductor portion. The second columnar body extends in the first direction within the first stacked body and includes a second semiconductor portion and a second insulator provided between the second columnar body and the second semiconductor portion. The first and second columnar bodies are arranged in a second direction intersecting the first direction. The semiconductor storage device further includes a second conductive film, a third insulator, and a third conductive film. The second conductive film is provided above the first stacked body and extending in a third direction intersecting the first direction and the second direction. The third insulator is provided in the second direction with respect to the second conductive film and extending in the third direction. The third conductive film is provided in the second direction with respect to the third insulator and extending in the third direction. The semiconductor storage device further includes a third columnar body and a fourth columnar body. The third columnar body is provided on the first columnar body and includes a fourth insulator and a third semiconductor portion provided between the second conductive film and the fourth insulator and between the third insulator and the fourth insulator. The third semiconductor portion 1s electrically connected to the second conductive film. The fourth columnar body is provided on the second columnar body and including a fifth insulator and a fourth semiconductor portion provided between the third conductive film and the fifth insulator and between the third insulator and the fifth insulator. The fourth semiconductor portion is electrically connected to the third conductive film. A thickness of the third semiconductor portion in the first direction is greater than a thickness of the second conductive film in the first direction.

Hereinafter, certain example embodiments of to the present disclosure will be described with reference to the drawings. The described examples are not intended to limit the present disclosure. In the following description, the vertical direction (up-down direction) is generally referenced to a semiconductor substrate and indicates a relative direction from the surface of the semiconductor substrate. The vertical direction may be different from the direction of gravity. The drawings are schematic or conceptual, and the scale of each part is not always the same as the actual one. In the specification and the drawings, the same elements previously described with respect to one drawing will be designated by the same reference numerals, and detailed descriptions thereof will be omitted as appropriate.

First Embodiment (Structure of Semiconductor Storage Device)

The overall structure of a semiconductor storage device 100 according to a first embodiment is illustrated in FIGS. 1A to 2B. FIG. 1A illustrates a schematic perspective view of an example of the semiconductor storage device 100 according to the first embodiment. FIG. 1B illustrates a schematic plan view of an example of a first stacked body 1. In the present specification, the stacking direction of the first stacked body 1 is referred to as the Z-axis direction or a thickness direction. FIGS. 2A and 2B illustrate respectively schematic cross-sectional views of an example of a memory cell of a three-dimensional structure.

The semiconductor storage device 100 illustrated in FIG. 1A is a non-volatile memory having a memory cell of a three-dimensional structure. The semiconductor storage device 100 includes the first stacked body 1, a second stacked body 2, a base portion 3, a plurality of first columnar bodies CL1 (see FIGS. 2A and 2B), a plurality of second columnar bodies CL2, a plurality of third columnar bodies CL3, and a plurality of fourth columnar bodies CL4. The plurality of first columnar bodies CL1 and second columnar bodies CL2 are provided inside the first stacked body 1, and the plurality of third columnar bodies CL3 and fourth columnar bodies CL4 are provided inside the second stacked body 2.

The first stacked body 1 is formed by stacking a plurality of first conductive films 11 in alternation with a plurality of first insulating films 12 along a first direction. In this context, the Z-axis direction is considered the first direction. The Y-axis direction is referred to as a second direction, and the X-axis direction is referred to as a third direction. The first stacked body 1 is provided above the base portion 3. The first conductive films 11 are made of conductive metal, and contain, for example, tungsten. The first insulating films 12 contain, for example, a silicon oxide. The first insulating films insulate the first conductive films 11 vertically adjacent to each other in the Z-axis direction. The number of times the first conductive films 11 or the first insulating films 12 are stacked may be appropriately selected. The first insulating films 12 may be, for example, a silicon oxide ($SiO_2$) film. For example, an insulating film 1g is provided between the first stacked body 1 and a base semiconductor portion 33. The insulating film 1g contains, for example, silicon oxide.

The second stacked body 2 includes a wiring layer 21, a second insulating film 22, and a third insulating film 23, which are stacked above the first stacked body 1. The wiring layer 21 is provided above the second insulating film 22 and below the third insulating film 23. Further, the wiring layer 21 includes a second conductive film 21A and a third conductive film 21B. The second stacked body 2 is configured such that the wiring layer 21 is sandwiched between the second insulating film 22 and the third insulating film 23. The wiring layer 21 may be conductive metal, for example, tungsten (W). The second insulating film 22 and the third insulating film 23 may be, for example, silicon oxide ($SiO_2$) An interlayer insulating film 20 is provided between the first stacked body 1 and the second stacked body 2. The interlayer insulating film 20 may be, for example, silicon carbonitride (SiNC).

The base portion 3 is provided below the first stacked body 1, and includes a substrate 30, a base insulating film 31, a base conductive film 32, and the base semiconductor portion 33. The substrate 30 has a first surface and a second surface, and the first surface is the Z-axis direction which is the first direction. The base insulating film 31 is provided on the first surface of the substrate 30. The base conductive film 32 is provided on the base insulating film 31. The base semiconductor portion 33 is provided on the base conductive film 32. The substrate 30 is made of a semiconductor substrate, and may be, for example, a silicon substrate. The conductivity type of silicon (Si) may be, for example, p-type. For example, an element separation region 30i is provided in the surface region of the substrate 30. The element separation region 30i is, for example, an insulating region containing silicon oxide, and partitions an active area AA in the surface region of the substrate 30. The active area AA is provided with source and drain regions of a transistor Tr. The transistor Tr constitutes a peripheral circuit of a non-volatile memory. The base insulating film 31 contains, for example, silicon oxide ($SiO_2$), and insulates the transistor Tr. A wiring 31a is provided in the base insulating film 31. The wiring 31a is electrically connected to the transistor Tr. The base conductive film 32 contains conductive metal such as tungsten (W). The base semiconductor portion 33 contains, for example, silicon. The conductivity type of silicon may be, for example, n-type. A part of the base semiconductor portion 33 may contain undoped silicon.

As illustrated in FIG. 1A, in the semiconductor storage device 100 according to the present embodiment, the second stacked body 2 is stacked above the first stacked body 1, so that they are configured to form one stacked body. More specifically, a conductive film 14 in the lower region of the first stacked body 1 close to the base portion 3 includes a source-side select gate SGS, and the upper region of the second stacked body 2 far from the base portion 3 includes a drain-side select gate SGD. A word line WL is provided between the source-side select gate SGS and the drain-side select gate SGD. Further, the source-side select gate SGS is a gate electrode of a source-side select transistor STS. The word line WL serves as or is connected to a gate electrode of a memory cell MC. The drain-side select gate SGD serves as or is connected to a gate electrode of a drain-side select transistor STD.

The memory cell MC is connected in series between the source-side select transistor STS and the drain-side select transistor STD. Such a structure in which the source-side select transistor STS, the memory cell MC, and the drain-side select transistor STD are connected in series is called a memory string or a NAND string. This memory string is connected to a bit line BL via, for example, contacts CH and VY. The bit line BL is provided above the second stacked body 2, and extends in the second direction.

Figure 1B:
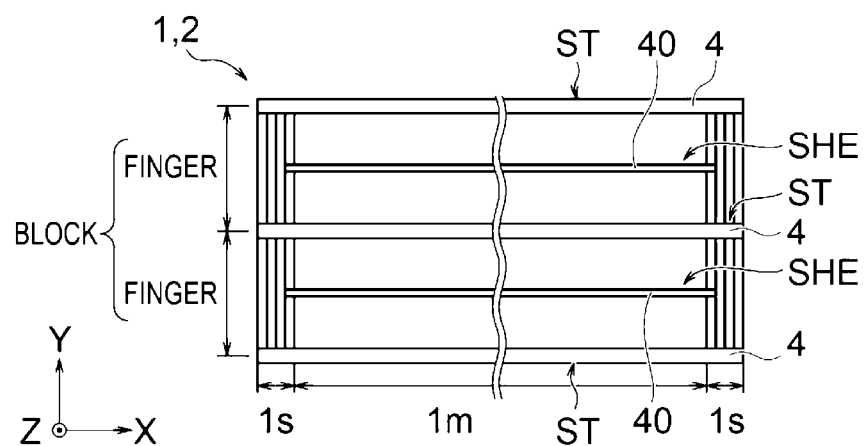
FIG. 1B is a schematic plan view of a first stacked body.
Figure 3A:
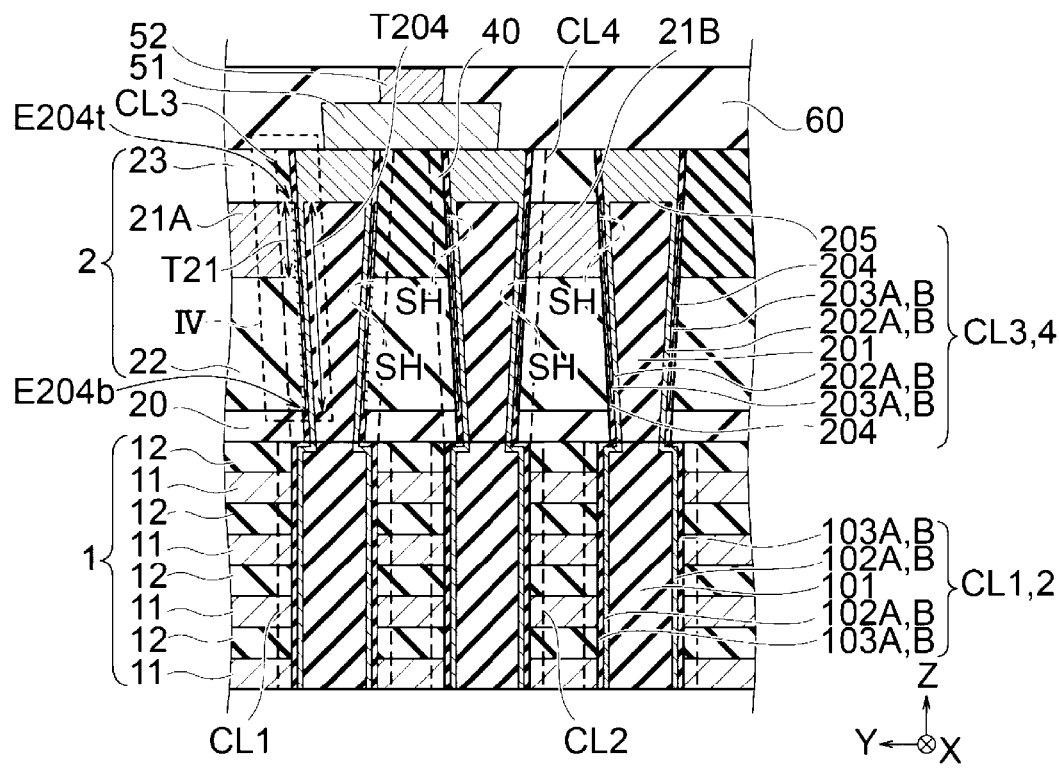
FIG. 3A illustrates a schematic cross-sectional view of an example of a semiconductor storage device according to a first embodiment.

A deep slit ST (see FIG. 1B) penetrating the first stacked body 1 and the second stacked body 2 and a shallow slit SHE penetrating the upper region of the second stacked body 2 are provided. The deep slit ST is provided within the second stacked body 2 and the first stacked body 1 to extend in the third direction and to penetrate the second stacked body 2 and the first stacked body 1 from the upper end of the second stacked body 2 into the base portion 3 (see FIG. 1B). A plate-shaped portion 4 includes a first insulating material. The first insulating material is, for example, silicon oxide. The plate-shaped portion 4 may contain a conductive material which is electrically insulated from the first stacked body 1 and the second stacked body 2 by the first insulating material and which is electrically connected to the base semiconductor portion 33. As illustrated in FIG. 1B, the shallow slit SHE extends in the third direction from the upper end of the second stacked body 2 to the middle of the second stacked body 2. Specifically, as illustrated in FIG. 3A, the shallow slit SHE penetrates the third insulating film 23 and the wiring layer 21 of the second stacked body 2 to separate the wiring layer 21. The shallow slit SHE is provided with a third insulator 40, and includes a second insulating material. The second insulating material is, for example, silicon oxide.

Next, as illustrated in FIG. 1B, the stacked body including the first stacked body 1 and the second stacked body 2 includes a stepped portion 1s and a memory cell array 1m. The stepped portion 1s is provided at the edge of the stacked body. The memory cell array 1m is sandwiched or surrounded by the stepped portion 1s. The deep slit ST extends from the stepped portion 1s at one end of the stacked body to the stepped portion 1s at the other end of the stacked body via the memory cell array 1m. A portion of the stacked body sandwiched between two plate-shaped portions 4 is called a finger. A single finger or a combination of multiple fingers is called a block. A string is provided within the finger by being sandwiched and partitioned with the shallow slit SHE or by connecting the drain-side select gate SGD. In the present embodiment, each string is provided by connecting two drain-side select gates SGD, and four memory holes MH belong to the string. Different bit lines BL are connected to respective strings.

Each of the plurality of first columnar bodies CL1 and the plurality of second columnar bodies CL2 is provided in the memory hole MH provided in the first stacked body 1. The memory hole MH penetrates the first stacked body 1 from the upper end of the first stacked body 1 into the substrate 30 along the first direction (FIG. 3A). A plurality of memory cells MC are provided corresponding to the intersection of the first conductive film 11 and the first columnar body CL1 and the intersection of the first conductive film 11 and the second columnar body CL2 of the first stacked body 1. Each of the plurality of first columnar bodies CL1 includes a first insulator column 101 extending in the first direction within the first stacked body 1, a first semiconductor portion 102A provided on the outer periphery of the first insulator column 101, and a first insulator 103A provided on the outer periphery of the first semiconductor portion 102A. Each of the plurality of second columnar bodies CL2 includes the first insulator column 101 extending in the first direction within the first stacked body 1, a second semiconductor portion 102B provided on the outer periphery of the first insulator column 101, and a second insulator 103B provided on the outer periphery of the second semiconductor portion 102B. The first semiconductor portion 102A and the second semiconductor portion 102B are electrically connected to the base semiconductor portion 33 of the base portion 3. The first insulator 103A and the second insulator 103B include a cover insulating film 103a, a charge capture film 103b, and a tunnel insulating film 103c of the plurality of memory cells MC.

As illustrated in FIGS. 2A and 2B, the shape of the memory hole MH in the X-Y plane is substantially circular. In other words, the cross section of the first columnar body CL1 and the second columnar body CL2 in the direction substantially perpendicular to the first direction is substantially circular. A block insulating film 11a forming a part of the first insulator 103A and the second insulator 103B may be provided between the first conductive film 11 and the first insulating film 12. The block insulating film 11a is, for example, a silicon oxide film or a metal oxide film. The metal oxide film may be, for example, aluminum oxide. A barrier film 11b may be provided between the first conductive film 11 and the first insulating film 12 and between the first conductive film 11 and the first insulator 103A/the second insulator 103B. The barrier film 11b may be, for example, a film having a stacked structure of titanium nitride and titanium, for example, when the first conductive film 11 is tungsten. The block insulating film 11a serves to prevent the back tunneling of electric charges from the first conductive film 11 to the first insulator 103A/the second insulator 103B side. The barrier film 11b serves to enhance the adhesion between the first conductive film 11 and the block insulating film 11a.

The shape of the first semiconductor portion 102A and the second semiconductor portion 102B is, for example, a bottomed tubular shape. The first semiconductor portion 102A and the second semiconductor portion 102B contain, for example, silicon. The silicon may be, for example, polysilicon obtained by crystallizing amorphous silicon. The first semiconductor portion 102A and the second semiconductor portion 102B are, for example, undoped silicon. Further, the first semiconductor portion 102A and the second semiconductor portion 102B may be p-type silicon. The first semiconductor portion 102A and the second semiconductor portion 102B function as a channel region of the memory cell MC and the source-side select transistor STS.

A portion of the first insulator 103A and the second insulator 103B other than the block insulating film 11a is provided between the inner wall of the memory hole MH and the first semiconductor portion 102A and the second semiconductor portion 102B. The first insulator 103A and the second insulator 103B have, for example, a tubular shape. The plurality of memory cells MC have a storage region between the first semiconductor portion 102A and the second semiconductor portion 102B and the first conductive film 11 serving as the word line WL, and are stacked in the Z-axis direction. The first insulator 103A and the second insulator 103B include, for example, the cover insulating film 103a, the charge capture film 103b, and the tunnel insulating film 103c. Each of the first semiconductor portion 102A, the charge capture film 103b, and the tunnel insulating film 103c extends in the first direction.

The cover insulating film 103a is provided between the first insulating film 12 and the charge capture film 103b. The cover insulating film 103a contains, for example, silicon oxide. The cover insulating film 103a protects the charge capture film 103b from being etched during another manufacturing step, specifically, during a replacement step of replacing a first sacrificial layer 5 with the first conductive film 11. The cover insulating film 103a may be removed from between the first conductive film 11 and the first insulator 103A and the second insulator 103B during the replacement step. As illustrated in FIGS. 2A and 2B, for example, the block insulating film 11a is provided between the first conductive film 11 and the charge capture film 103b. Further, when the replacement step is not performed to form the first conductive film 11, the cover insulating film 103a may not be provided.

The charge capture film 103b is provided between the block insulating film 11a and the cover insulating film 103a and the tunnel insulating film 103c. The charge capture film 103b contains, for example, silicon nitride, and has a trap site that traps charges in the film. A portion of the charge capture film 103b sandwiched between the first conductive film 11 serving as the word line WL and the first semiconductor portion 102A and the second semiconductor portion 102B constitutes the storage region of the memory cell MC as a charge capture portion. The threshold voltage of the memory cell MC changes according to the presence or absence of charges in the charge capture portion, or the amount of charges captured in the charge capture portion. In this way, the memory cell MC stores information.

The tunnel insulating film 103c is provided between the first semiconductor portion 102A and the second semiconductor portion 102B and the charge capture film 103b. The tunnel insulating film 103c contains, for example, silicon oxide, or both of silicon oxide and silicon nitride. The tunnel insulating film 103c is a potential barrier between the first semiconductor portion 102A and the second semiconductor portion 120B and the charge capture film 103b. For example, when electrons are injected from the first semiconductor portion 102A and the second semiconductor portion 102B into the charge capture portion (writing operation) and when holes are injected from the first semiconductor portion 102A and the second semiconductor portion 102B into the charge capture portion (erasing operation), the electrons and the holes pass through (undergo tunneling) the potential barrier of the tunnel insulating film 103c, respectively.

As described above, the first insulator 103A and the second insulator 103B include the cover insulating film 103a, the charge capture film 103b, and the tunnel insulating film 103c. Thus, the first insulator 103A and the second insulator 103B include a stacked film in which a silicon oxide film, a silicon nitride film, and a silicon oxide film are stacked.

The first insulator column 101 is embedded in the internal space of the tubular first semiconductor portion 102A and the tubular second semiconductor portion 102B. The shape of the first insulator column 101 is, for example, a columnar shape. The first insulator column 101 contains, for example, silicon oxide, and is insulating.

Next, the drain-side select gate SGD region of the semiconductor storage device 100 according to the first embodiment (a portion related to the second stacked body 2, the third columnar body CL3, and the fourth columnar body CL4) will be described in detail with reference to FIGS. 3A, 3B and 4.

As illustrated in FIG. 3A, each of the third columnar body CL3 and the fourth columnar body CL4 is provided within the second stacked body 2. Specifically, the third columnar body CL3 and the fourth columnar body CL4 penetrate the second stacked body 2 and the interlayer insulating film 20 from the upper end of the second stacked body 2 to the first stacked body 1 along the first direction. As illustrated in FIG. 3A, the third columnar body CL3 may be provided above the first columnar body CL1, and the fourth columnar body CL4 may be provided above the second columnar body CL2. Further, the area of the lower surface of the third columnar body CL3 may be smaller than the area of the upper surface of the first columnar body CL1, and the area of the lower surface of the fourth columnar body CL4 may be smaller than the area of the upper surface of the second columnar body CL2. Further, as illustrated in FIG. 3B, the cross section of the third columnar body CL3 and the fourth columnar body CL4 in the direction substantially perpendicular to the stacking direction may be substantially circular. Then, the drain-side select gate SGD is provided at the intersection of the wiring layer 21 of the second stacked body 2 with the third columnar body CL3 and the fourth columnar body CL4. That is, the drain-side select gate SGD corresponding to the source-side select gate SGS provided in the lower region of the first stacked body 1 is provided in a region of the second stacked body 2. Specifically, the drain-side select gate SGD is provided at each of the intersection of the second conductive film 21A and a third semiconductor portion 202A and the intersection of the third conductive film 21B and a fourth semiconductor portion 202B.

Each of the plurality of third columnar bodies CL3 includes a second insulator column 201, the third semiconductor portion 202A, a fourth insulator 203A, a gate electrode film 204, and a cap silicon layer 205. Each of the plurality of fourth columnar bodies CL4 includes the second insulator column 201, the fourth semiconductor portion 202B, a fifth insulator 203B, the gate electrode film 204, and the cap silicon layer 205. The second insulator column 201 is provided on the first insulator column 101, and extends in the first direction within the second stacked body 2. Each of the third semiconductor portion 202A and the fourth semiconductor portion 202B is provided on the outer periphery of the second insulator column 201. The fourth insulator 203A is provided on the outer periphery of the third semiconductor portion 202A, and the fifth insulator 203B is provided on the outer periphery of the fourth semiconductor portion 202B. The gate electrode film 204 is provided on the outer periphery of the fourth insulator 203A and the fifth insulator 203B. The cap silicon layer 205 is provided above the second insulator column 201.

The shape of the third semiconductor portion 202A and the fourth semiconductor portion 202B is, for example, a tubular shape. The third semiconductor portion 202A and the fourth semiconductor portion 202B function as a channel region of the drain-side select gate SGD.

The third semiconductor portion 202A may be continuous with and have the same configuration as the first semiconductor portion 102A. The fourth semiconductor portion 202B may be continuous with and have the same configuration as the second semiconductor portion 102B. For the third semiconductor portion 202A and the fourth semiconductor portion 202B, for example, silicon may be used. The silicon may be, for example, polysilicon obtained by crystallizing amorphous silicon. The third semiconductor portion 202A and the fourth semiconductor portion 202B are, for example, undoped silicon. Further, the third semiconductor portion 202A and the fourth semiconductor portion 202B may be p-type silicon.

The fourth insulator 203A is provided on the outer periphery of the third semiconductor portion 202A, and the fifth insulator 203B is provided on the outer periphery of the fourth semiconductor portion 202B. The fourth insulator 203A may be continuous with and have the same configuration as the first insulator 103A. The fifth insulator 203B may be continuous with and have the same configuration as the second insulator 103B.

The fourth insulator 203A and the fifth insulator 203B may include a stacked film (ONO film) in which a silicon oxide film, a silicon nitride film, and a silicon oxide film are stacked. The first insulator 103A and the second insulator 103B are provided in the first stacked body 1 as a memory cell array, and function as a charge storage film of a memory cell. That is, a plurality of memory cells are provided corresponding to the intersection of the first conductive film 11 and the first columnar body CL1 and the intersection of the first conductive film 11 and the second columnar body CL2.

The gate electrode film 204 is provided on the outer periphery of the fourth insulator 203A and the fifth insulator 203B, and constitutes the drain-side select gate SGD. The gate electrode film 204 contains, for example, silicon. The silicon may be phosphorus (P)-doped polysilicon obtained by crystallizing amorphous silicon. Further, the gate electrode film 204 may be n-type silicon. Furthermore, the gate electrode film 204 may be titanium nitride (TiN).

The cap silicon layer 205 is provided above the second insulator column 201, and is connected to the third semiconductor portion 202A and the fourth semiconductor portion 202B. Furthermore, the cap silicon layer 205 is connected to wiring structures 51 and 52 provided thereabove. The cap silicon layer 205 contains, for example, silicon. The silicon may be, for example, doped polysilicon obtained by crystallizing amorphous silicon. Further, the cap silicon layer 205 may be n-type silicon.

As described above, the third columnar body CL3 and the fourth columnar body CL4 are respectively configured. As illustrated in FIG. 3A, the wiring layer 21 (the second conductive film 21A and the third conductive film 21B) is provided between the third columnar body CL3 and the fourth columnar body CL4 adjacent to each other, and is connected to the gate electrode film 204. Further, the area of the lower surface of the third columnar body may be smaller than the area of the upper surface of the first columnar body, and the area of the lower surface of the fourth columnar body may be smaller than the area of the upper surface of the second columnar body.

Here, a relationship between the second conductive film 21A and the gate electrode film 204 will be described in detail with reference to FIG. 4. FIG. 4 illustrates an enlarged view of the region surrounded by the broken line IV in FIG. 3A. As illustrated in FIG. 4, the thickness (length) of the gate electrode film 204 in the channel longitudinal direction of the drain-side select gate SGD is thicker (longer) than the thickness of the second conductive film 21A in the channel longitudinal direction. Here, the channel longitudinal direction is the channel longitudinal direction of a transistor used as the drain-side select gate SGD, and is the direction along the inner wall of a hole SH substantially in the first direction. The thickness T204 (distance between the upper end E204$t$ and the lower end E204$b$) of the gate electrode film 204 in the channel longitudinal direction is thicker than the thickness T21 of the second conductive film 21A. Therefore, even if the thickness T21 of the second conductive film 21A is smaller than the channel length of the drain-side select gate SGD, the gate electrode film 204 may be provided over almost the entire channel length of the drain-side select gate SGD. Thus, it is possible to allow sufficient cell current to flow for each gate electrode film 204.

Figure 4:
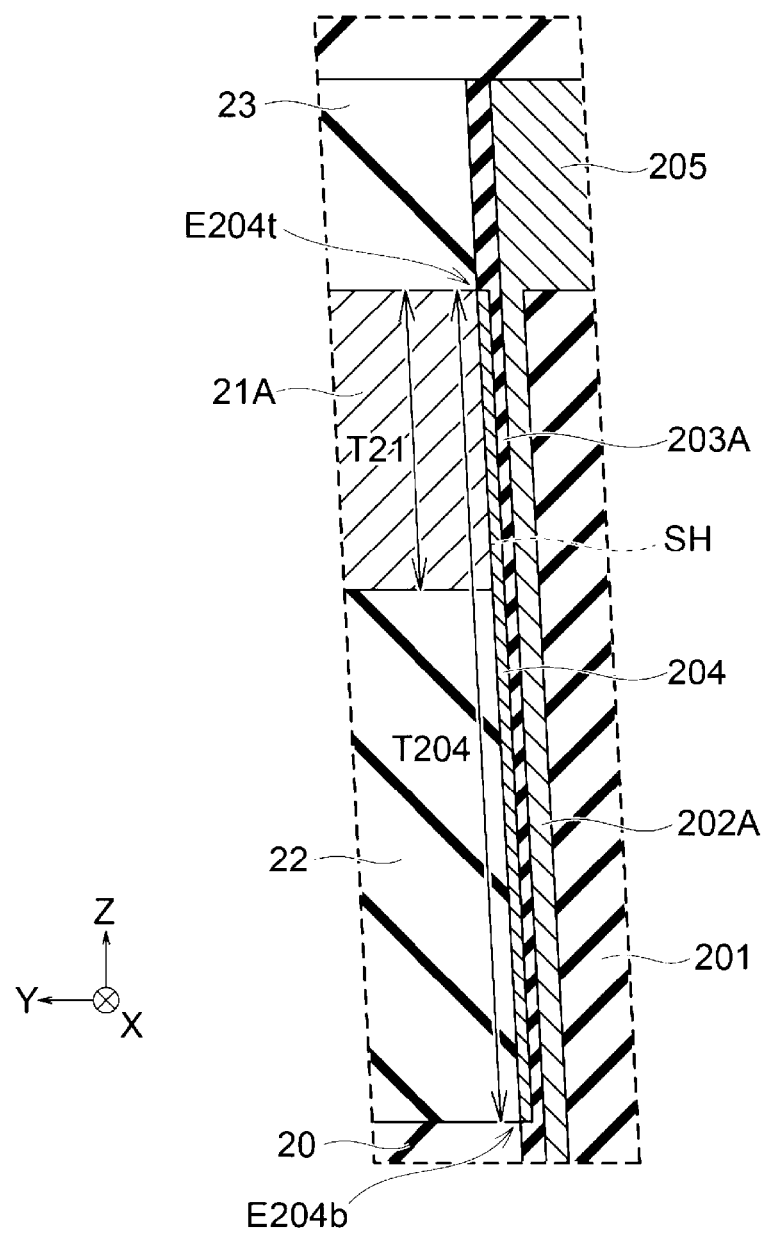
FIG. 4 illustrates an enlarged view of a portion including a wiring layer and a gate electrode film illustrated in FIG. 3A.

Further, in FIG. 4, the levels of the upper end of the second conductive film 21A and the upper end E204$t$ of the gate electrode film 204 are illustrated to be equivalent. Meanwhile, in the present embodiment, the upper end E204$t$ of the gate electrode film 204 may be lower than the upper end of the second conductive film 21A. However, the upper end E204$t$ of the gate electrode film 204 is higher than the lower end of the second conductive film 21A. In other words, the gate electrode film 204 may be electrically connected to the second conductive film 21A. Since the second conductive film 21A and the gate electrode film 204 are electrically connected, when a voltage is applied to the second conductive film 21A, the voltage is also applied to the gate electrode film 204, which enables the flow of cell current.

A reference will again be made to FIG. 3A. The second insulator column 201 is embedded in the internal space of the tubular third semiconductor portion 202A. The second insulator column 201 may be continuous with and be made of the same material as the first insulator column 101. The shape of the second insulator column 201 may be, for example, a columnar shape. The second insulator column 201 contains, for example, silicon oxide, and is insulative.

The fourth insulator 203A is continuous with and is made of the same material as the first insulator 103A, and the third semiconductor portion 202A is continuous with and is made of the same material as the first semiconductor portion 102A. Furthermore, the second insulator column 201 is continuous with and is made of the same material as the first insulator column 101. Thus, the fourth insulator 203A, the second insulator column 201, the first semiconductor portion 102A, and the third semiconductor portion 202A are common to the first columnar body CL1 on the first stacked body 1 side and the third columnar body CL3 on the drain-side select gate SGD side, and are able to be formed at the same time.

As described above, a select gate part including the plurality of third columnar body CL3 and fourth columnar body CL4 as well as the second conductive film 21A and the third conductive film 21B (the wiring layer 21) is configured. That is, the drain-side select gate SGD is configured.

The wiring structures 51 and 52 may be provided above the third columnar body CL3 and the fourth columnar body CL4. For example, the wiring structure 51 is made of a conductive substance such as titanium (Ti), titanium nitride (TiN), or tungsten (W). The wiring structure 52 is made of a conductive substance such as TiN or W. Furthermore, the wiring structures 51 and 52 are connected to the bit line BL thereabove. In this way, the bit line BL, the wiring structures 51 and 52, the cap silicon layer 205, the third semiconductor portion 202A, and the fourth semiconductor portion 202B are electrically connected. An interlayer insulating film 60 is provided above the third columnar body CL3, the fourth columnar body CL4, and the second stacked body 2. The interlayer insulating film 60 may be, for example, silicon oxide.

Next, the arrangement of the third columnar body CL3 and the fourth columnar body CL4 in the plane layout will be described.

Figure 3B:
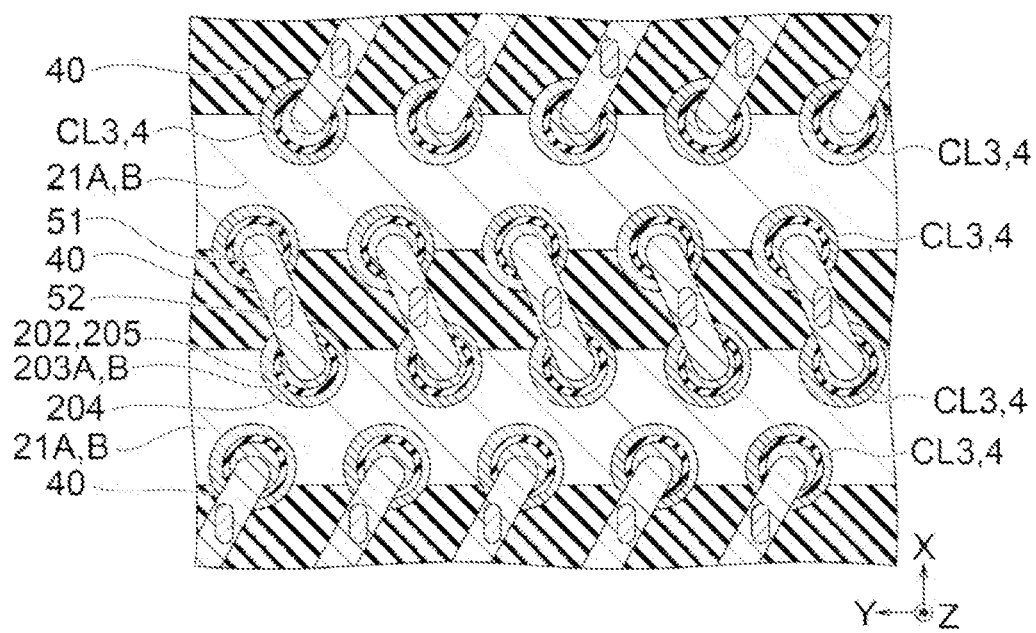
FIG. 3B illustrates a schematic plan view of an example of a semiconductor storage device according to a first embodiment.

FIG. 3B illustrates a schematic plan view of the third columnar body CL3 and the fourth columnar body CL4 arranged in the semiconductor storage device 100 according to the present embodiment. That is, FIG. 3B illustrates the semiconductor storage device 100 illustrated in FIG. 3A as viewed from the Z-axis direction. In order to illustrate the arrangement of the third columnar body CL3 and the fourth columnar body CL4, the interlayer insulating film 60 is not depicted.

The plurality of third columnar body CL3 and fourth columnar body CL4 are two-dimensionally arranged in the X-Y plane (in the second direction and the third direction). That is, the plurality of third columnar body CL3 and fourth columnar body CL4 are arranged two-dimensionally in the plan view as viewed from the stacking direction. The arrangement of the third columnar bodies CL3 and the fourth columnar bodies CL4 may be, for example, a staggered arrangement.

Similarly, the wiring layer 21 (the second conductive film 21A and the third conductive film 21B) and the third insulator 40 are also two-dimensionally arranged in the X-Y plane. Specifically, the wiring layer 21 and the third insulator 40 are alternately provided in the X-axis direction. That is, the wiring layer 21 and the third insulator 40 are alternately arranged in a stripe shape in the X-axis direction. Meanwhile, the wiring layer 21 and the third insulator 40 linearly extend, respectively, in the Y direction. The wiring layer 21 is provided in between the arrangement of the third columnar body CL3 and the fourth columnar body CL4 adjacent to each other. In other words, the third columnar body CL3 and the fourth columnar body CL4 are provided on the boundary line between the wiring layer 21 and the third insulator 40, and the side surfaces of the third columnar body CL3 and the fourth columnar body CL4 corresponding to about half a circle are connected to the wiring layer 21. About half of the gate electrode film 204 covering the outer periphery of the third columnar body CL3 and the fourth columnar body CL4 is in contact with the wiring layer 21. However, the gate electrode film 204 itself is provided over the entire circumference of the third semiconductor portion 202A and the fourth semiconductor portion 202B. Thus, the drain-side select gate SGD portion for allowing the flow of cell current may be secured over the entire circumference of the third semiconductor portion 202A and the fourth semiconductor portion 202B, which may enhance the cell current. Further, by providing the drain-side select gate SGD portion over the entire circumference of the third semiconductor portion 202A and the fourth semiconductor portion 202B, the occurrence of off-leakage of the drain-side select gate SGD may be prevented.

Meanwhile, the third insulator 40 is provided in between the arrangement of the third columnar body CL3 and the fourth columnar body CL4 adjacent to each other. In this case, the third columnar body CL3 and the fourth columnar body CL4 adjacent to each other are connected by the wiring structures 51 and 52. In other words, the plurality of third columnar body CL3 and fourth columnar body CL4 which are adjacent to each other with the third insulator 40 interposed therebetween are electrically connected by the wiring structures 51 and 52 provided above the third columnar body CL3 and the fourth columnar body CL4. Specifically, the wiring structures 51 and 52 are connected to the cap silicon layer 205 of the third columnar body CL3 and the fourth columnar body CL4. The cap silicon layer 205 is connected to the third semiconductor portion 202A and the fourth semiconductor portion 202B. Therefore, the third semiconductor portion 202A of the third columnar body CL3 and the fourth semiconductor portion 202B of the fourth columnar body CL4 which are adjacent to each other are electrically connected via the wiring structures 51 and 52.

The bit line BL extends in the X direction, and is provided on the wiring structure 52 which is a via contact among the wiring structures 51 and 52. The bit line BL is electrically connected to the third semiconductor portion 202A of the third columnar body CL3 and further to the first semiconductor portion 102A of the first columnar body CL1 via the wiring structures 51 and 52.

As described above, with the semiconductor storage device 100 according to the present embodiment, in the drain-side select gate SGD, the thickness of the gate electrode film 204 in the channel longitudinal direction is greater than the thickness of the wiring layer 21 (the second conductive film 21A and the third conductive film 21B). Since the gate electrode film 204 may be provided over almost the entire channel region of the drain-side select gate SGD, it is possible to allow sufficient cell current to selectively flow for each gate electrode film 204. Further, since the gate electrode film 204 is provided over the entire circumference of the third semiconductor portion 202A and the fourth semiconductor portion 202B, the off-leakage current in the drain-side select gate SGD may be reduced.

By providing the wiring structures 51 and 52 above the cap silicon layer 205, the third columnar body CL3 and the fourth columnar body CL4 adjacent to each other may be electrically connected. That is, the third columnar body CL3 and the fourth columnar body CL4 which are adjacent to both sides of the third insulator 40 may also be connected to the wiring structures 51 and 52 via the cap silicon layer 205. By providing the wiring structures 51 and 52 in this way, the required number of wiring structures 52 to be arranged may be substantially half the number of arranged third columnar bodies CL3 and fourth columnar bodies CL4.

(Manufacturing Method of Semiconductor Storage Device)

Next, a method of manufacturing the semiconductor storage device 100 according to the present embodiment will be described with reference to FIGS. 5A to 18C.

Figure 5A:
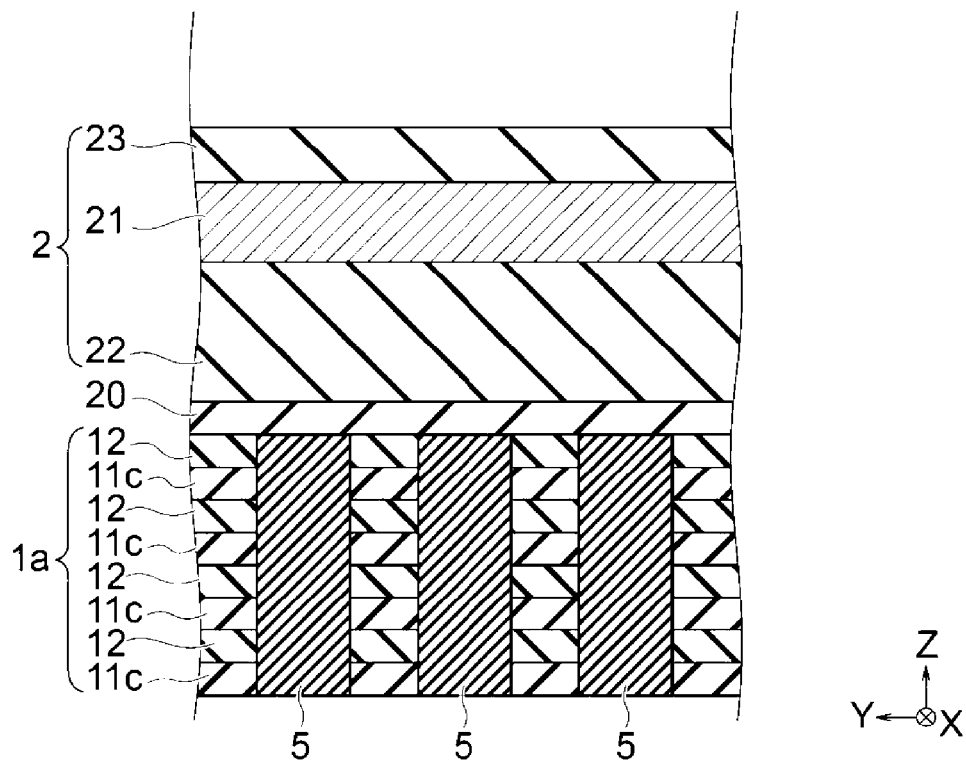
FIG. 5A illustrates a cross-sectional view related to manufacturing processes of a semiconductor storage device according to a first embodiment.

As illustrated in FIG. 5A, a first stacked body 1a in which a plurality of material films 11c and first insulating films 12 are alternately stacked is formed on the base portion 3 including the substrate 30 formed by a well-known method. The material film 11c may be, for example, silicon nitride (SiN), and the first insulating film 12 may be, for example, silicon oxide (SiO$_2$). Also in the description of the manufacturing method of the semiconductor storage device 100, the Z-axis direction is referred to as the first direction, the Y-axis direction is referred to as the second direction, and the X-axis direction is referred to as the third direction.

Figure 5B:
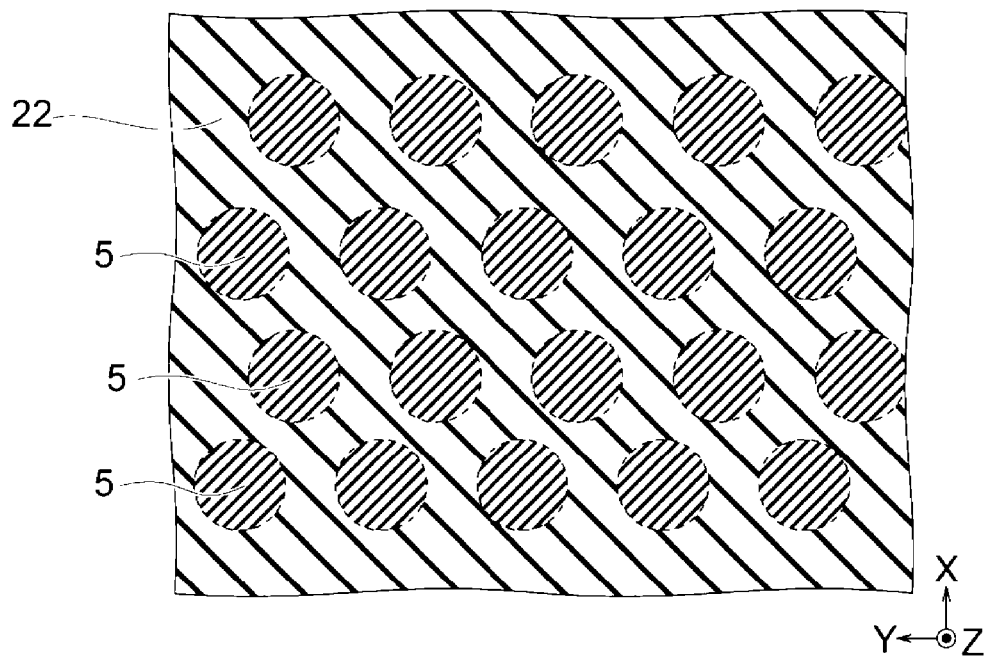
FIG. 5B illustrates a plan view corresponding to FIG. 5A.

Next, a plurality of memory holes MH of the first stacked body 1a are formed from above the first stacked body 1a by using, for example, a lithography technique and an etching technique. The plurality of memory holes MH may be formed in a staggered arrangement (FIG. 5B). Further, the diameter of the memory hole MH and the distance between the adjacent memory holes MH are appropriately selected. Furthermore, the plurality of formed memory holes MH are filled with the first sacrificial layer 5. Thus, a plurality of columnar first sacrificial layers 5 are formed to extend within the first stacked body 1a in the Z-axis direction, which is the stacking direction of the first stacked body 1a. For the first sacrificial layers 5, for example, carbon may be used.

Carbon is relatively highly flexible and does not warp. Further, carbon may be peeled off relatively easily with an asher in a subsequent step. That is, the use of carbon facilitates the removal of the first sacrificial layers 5. Furthermore, as described above, amorphous silicon may be used for the gate electrode film 204. In this case, the first sacrificial layers 5 may be easily selectively removed by using the asher. That is, the gate electrode film 204 may be left at the time of removing the first sacrificial layers 5 with the asher. Thus, by using carbon for the first sacrificial layers 5, the first sacrificial layers 5 in the memory holes MH may be easily and selectively removed.

Next, the interlayer insulating film 20 is formed on the first stacked body 1a and the first sacrificial layers 5. The interlayer insulating film 20 is an etching stopper when processing an oxide film in the second stacked body 2 in a subsequent step. For the interlayer insulating film 20, a material that does not dissolve in a phosphoric acid solution used for etching and processing selectivity is used. For that reason, the interlayer insulating film 20 may be, for example, silicon carbonitride (SiNC).

Next, the second stacked body 2 is formed on the interlayer insulating film 20. The second stacked body 2 is stacked in the order of the second insulating film 22, the wiring layer 21, and the third insulating film 23 from below, that is, from the interlayer insulating film 20 side. The wiring layer 21 may be conductive metal, for example, tungsten (W). The second insulating film 22 and the third insulating film 23 may be, for example, silicon oxide ($SiO_2$). By forming the wiring layer 21 containing conductive metal in advance like the second stacked body 2, the subsequent replacement step in the second stacked body 2 may be omitted.

For example, in order to form the wiring layer 21, there is a method of forming the wiring layer 21 by forming a sacrificial film between the second insulating film 22 and the third insulating film 23 in advance, and replacing this sacrificial film with the material of the wiring layer 21. In such a method, an additional replacement step in the second stacked body 2 is required, and there is a risk of voids being generated in the wiring layer 21 by the replacement step.

Meanwhile, in the present embodiment, since the wiring layer 21 is stacked together with the second insulating film 22 and the third insulating film 23 in advance, it is easy to adjust the thickness of the wiring layer 21 having a gate voltage transmission function. Furthermore, a replacement step is not required to form the wiring layer 21. Accordingly, the generation of voids in the wiring layer 21 may be prevented. Thus, the wiring resistance of the wiring layer 21 may be reduced, and the RC delay during a cell selection operation may be prevented.

Figure 6A:
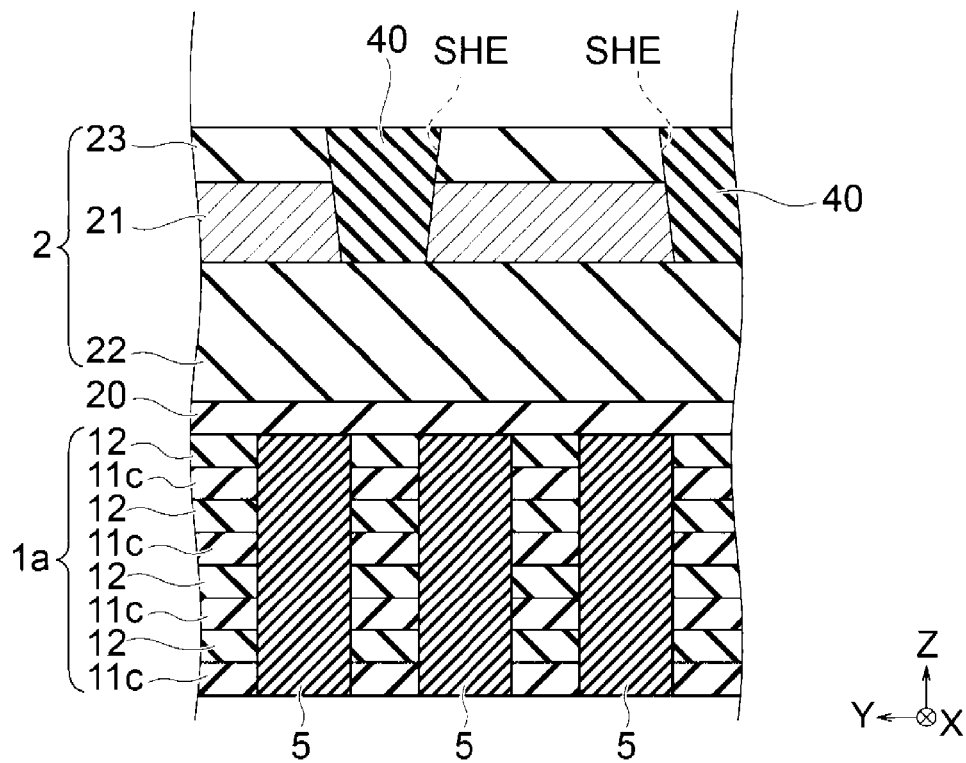
FIG. 6A illustrates a cross-sectional view related to manufacturing processes of a semiconductor storage device according to a first embodiment.
Figure 6B:
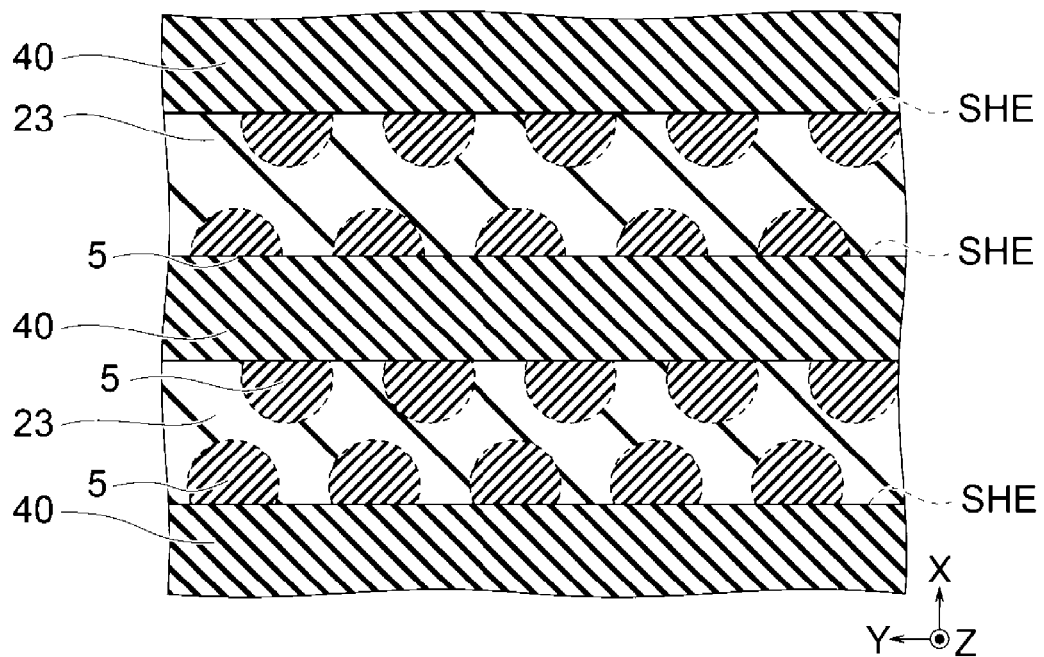
FIG. 6B illustrates a plan view corresponding to FIG. 6A.

Next, the shallow slits SHE are formed in the second stacked body 2 by using a lithography technique and a reactive ion etching (RIE) method (FIG. 6A). As illustrated in FIG. 6B, the shallow slits SHE are formed in a pattern of lines (each is a stripe shape) spaced from each other in the second direction (Y-direction). The shallow slits SHE extend in the third direction (X-direction). The first sacrificial layers 5 are spaced from each other in the second direction and arranged in shapeliness/rows in the plan view from the first direction. The arrangement interval between adjacent shallow slits SHE is twice the pitch between the rows of the first sacrificial layers. That is, as illustrated in FIG. 6B, when the second stacked body 2 is viewed from the first direction, the shallow slits SHE are positioned at twice the pitch of the rows of the first sacrificial layers 5, and each shallow slit SHE also overlaps a row of first sacrificial layers 5 by about half a diameter. In FIG. 6B, the first sacrificial layer 5 is illustrated so as to be visible for the sake of explanation. As illustrated in FIG. 6A, the shallow slit SHE is formed to a depth by which it penetrates the third insulating film 23 and the wiring layer 21. Further, the shallow slit SHE may be processed to have a rectangular shape. In this way, the wiring layer 21 may be separated by forming the shallow slit SHE to a depth at which it penetrates the wiring layer 21. Then, the wiring layer 21 and the third insulator 40 are alternately arranged in a stripe shape in the X-axis direction. The formed shallow slit SHE is filled with the third insulator 40. The interlayer insulator 40 may be, for example, silicon oxide.

Figure 7A:
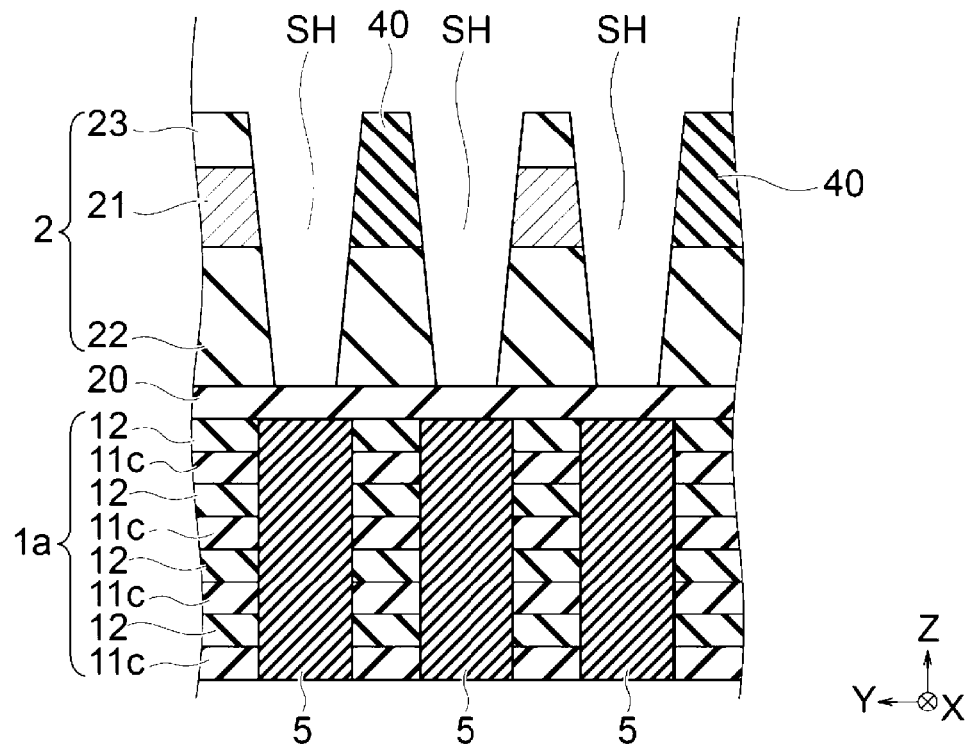
FIG. 7A illustrates a cross-sectional view related to manufacturing processes of a semiconductor storage device according to a first embodiment.
Figure 7B:
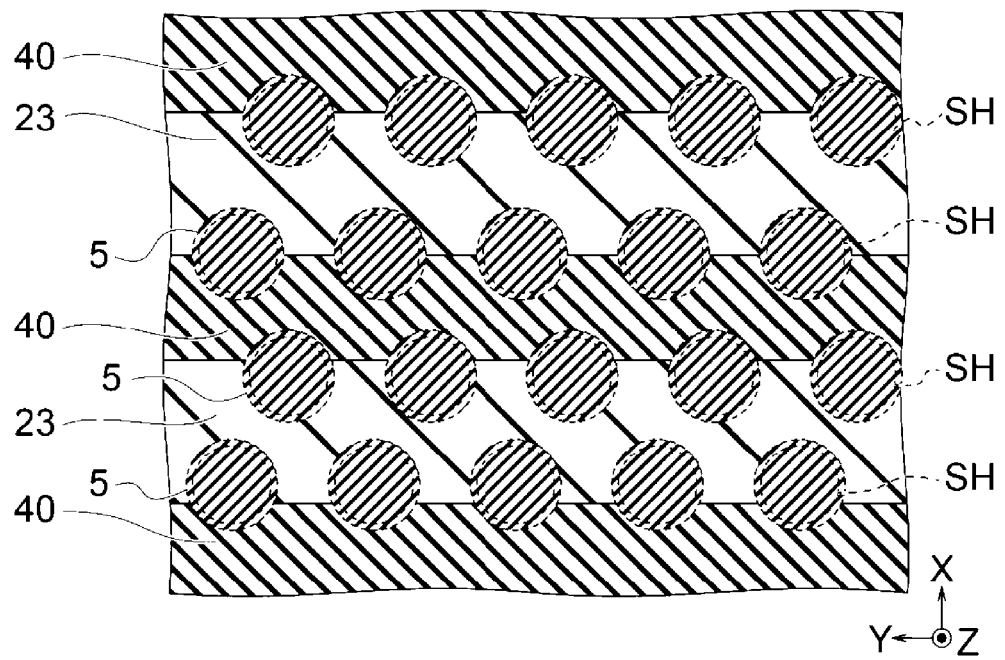
FIG. 7B illustrates a plan view corresponding to FIG. 7A.

Next, the hole SH is formed as a through-hole in the second stacked body 2 by using a lithography technique and an RIE method (FIG. 7A). The hole SH is formed in a portion above the first sacrificial layer 5 formed in the first stacked body 1*a*. That is, as illustrated in FIG. 7B, in the X-Y plane, the hole SH is provided such that the hole SH and the first sacrificial layer 5 are provided at substantially the same location and overlap each other in the Z-axis direction. By forming the hole SH in this way, a part of the third insulator 40 located above the first sacrificial layer 5 is removed. Also in FIG. 7B, the first sacrificial layer 5 is illustrated so as to be visible for the sake of explanation. The hole SH is formed deeply to penetrate the second insulating film 22 and reach the interlayer insulating film 20. That is, the hole SH is formed to reach the interlayer insulating film 20 which is an etching stopper. Further, the hole SH is formed so as to secure roundness like the memory hole of the first sacrificial layer 5.

Figure 8:
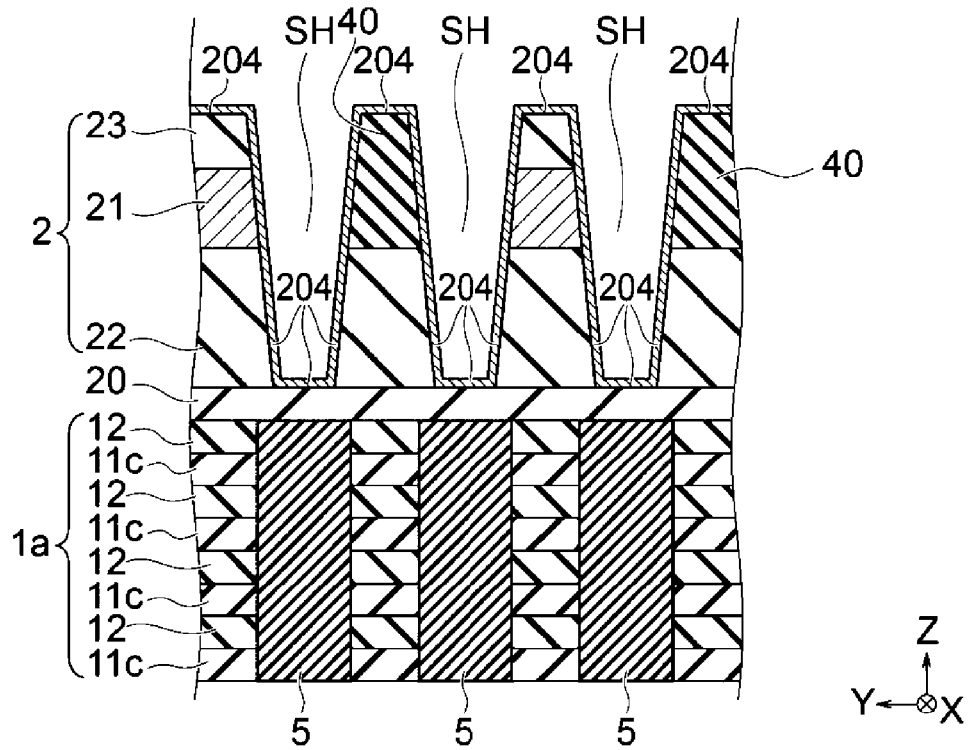
FIGS. 8 to 10 illustrate cross-sectional views related to manufacturing processes of a semiconductor storage device according to a first embodiment.

Next, the material of the gate electrode film 204 is deposited on the upper surface of the second stacked body 2, on the side surfaces of the third insulating film 23, the wiring layer 21, and the second insulating film 22 as the inner wall of the hole SH, and on the interlayer insulating film 20 as the bottom surface of the hole SH (FIG. 8). The material of the gate electrode film 204 contains, for example, silicon. The silicon may be phosphorus (P)-doped polysilicon obtained by crystallizing amorphous silicon. Further, the material of the gate electrode film 204 may be n-type silicon. Furthermore, the material of the gate electrode film 204 may be titanium nitride (TiN).

Figure 9:
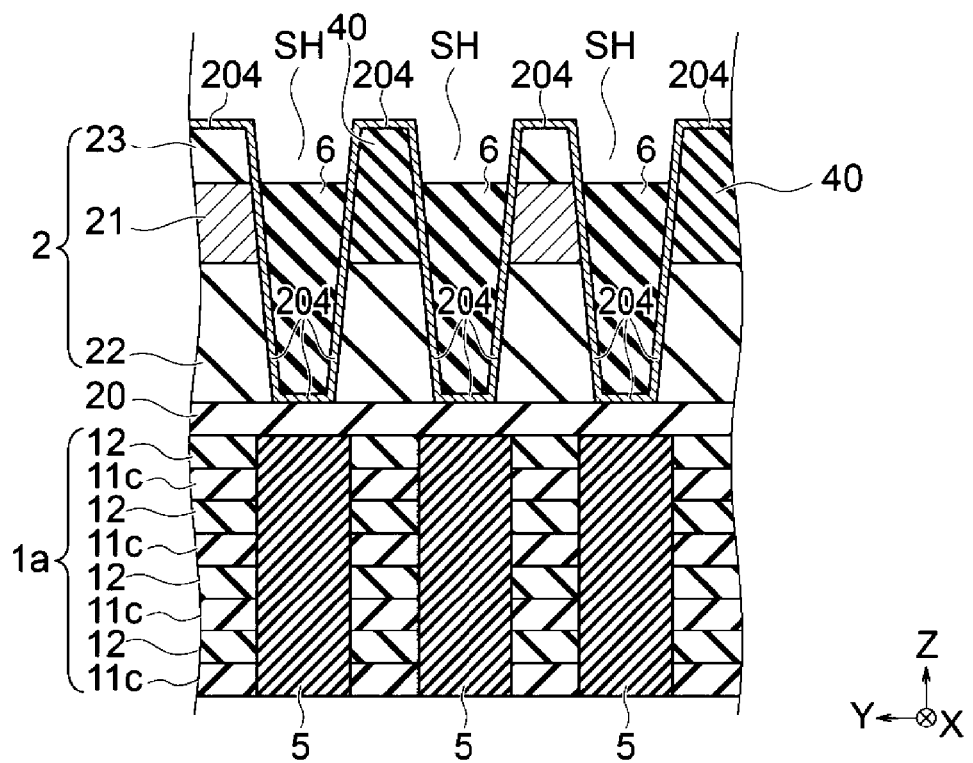

Next, a second sacrificial layer 6 is deposited in the hole SH (FIG. 9). For the second sacrificial layer 6, for example, carbon may be used. After deposition, the second sacrificial layer 6 is formed to a height by which it reaches the wiring layer 21 by etching back. Specifically, the second sacrificial layer 6 is formed to have a height that is equal to or higher than the lower surface of the wiring layer 21 (lower limit) and is equal to or lower than the upper surface of the third insulating film 23 (upper limit).

The lower limit height is set to ensure that the gate electrode film 204 will be in contact with the wiring layer 21 even after the gate electrode film 204 is processed. The upper limit height is set in to secure a distance (separation) between the gate electrode film 204 and the wiring structure 51 so as to maintain electrical insulation to provide the necessary breakdown voltage.

Figure 10:
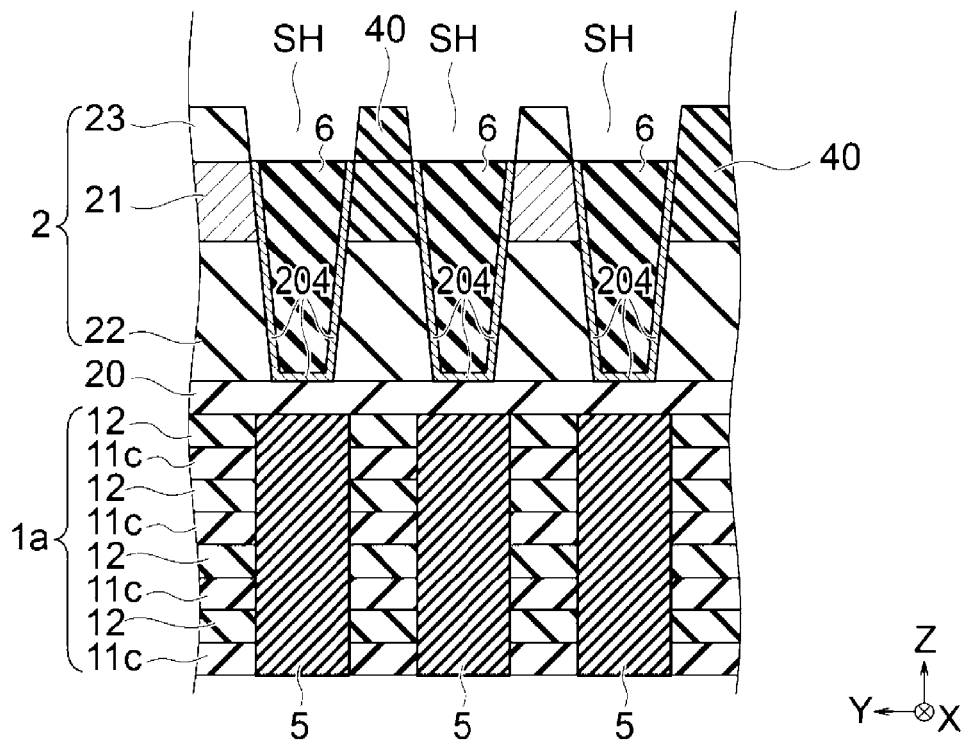

Next, the deposited material of the gate electrode film 204 is processed by reactive dry etching (chemical dry etching (CDE)) or wet etching using the deposited second sacrificial layer 6 as a mask (FIG. 10). That is, the material of the gate electrode film 204 which is not masked by the second sacrificial layer 6 is removed. The material of the gate electrode film 204 to be removed is a portion deposited on the upper surface of the third insulating film 23 and a portion deposited on the side surface of the third insulating film 23 as the inner wall of the hole SH in the upper surface portion of the second stacked body 2. Thus, the material of the gate electrode film 204 which is left by being masked by the second sacrificial layer 6 functions as the gate electrode film 204. The gate electrode film 204 is left on the side surfaces of the wiring layer 21 and the second insulating film 22. During this processing, side etching may occur. That is, a part of the upper surface portion of the second sacrificial layer 6 may be removed, and a part of the material of the gate electrode film 204 deposited on the side surface of the wiring layer 21 may also be removed. Thus, the upper end E204*t* (see FIG. 3A or FIG. 4) of the gate electrode film 204 may be at the same height as the upper surface of the wiring layer 21, but not necessarily at the same height. As described above, the upper end E204*t* of the gate electrode film 204 may be higher than or lower than the upper surface of the wiring layer 21. However, the upper end E204*t* of the gate electrode film 204 needs to be located higher than the bottom surface of the wiring layer 21 in order to be electrically connected to the wiring layer 21.

Figure 11A:
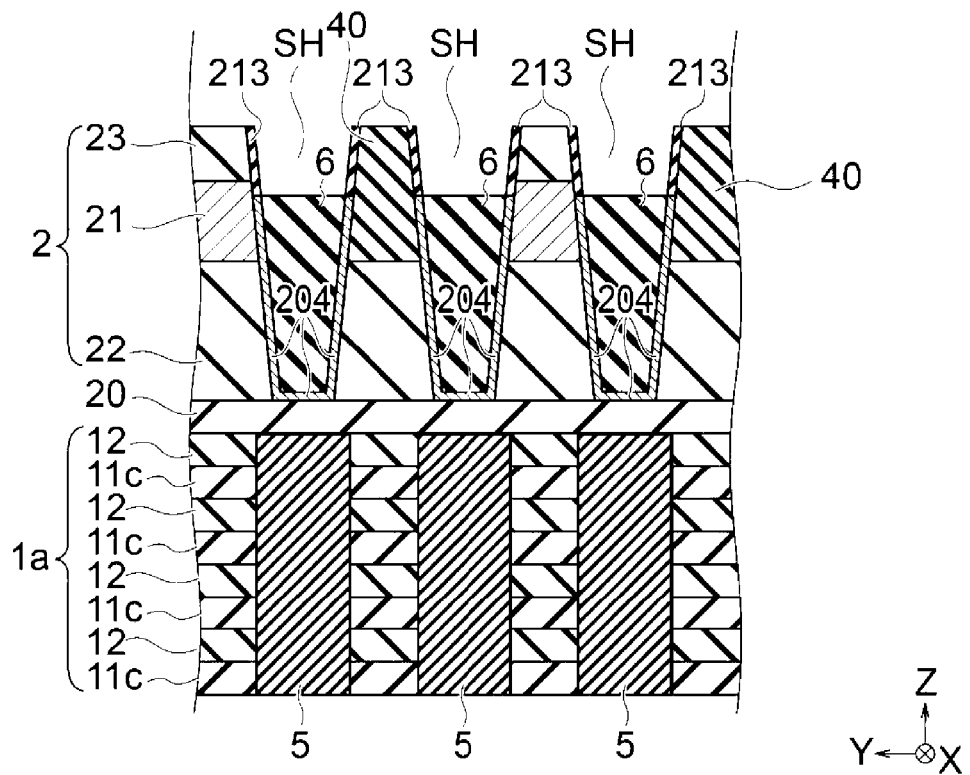
FIG. 11A illustrates a cross-sectional view related to manufacturing processes of a semiconductor storage device according to a first embodiment.
Figure 11B:
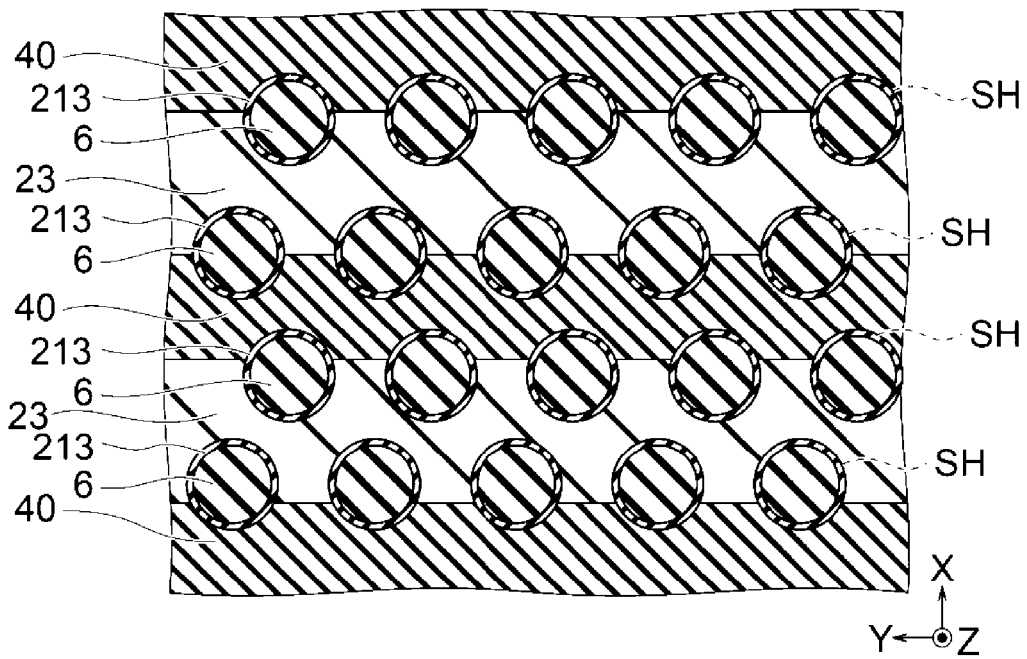
FIG. 11B illustrates a plan view corresponding to FIG. 11A.
Figure 12A:
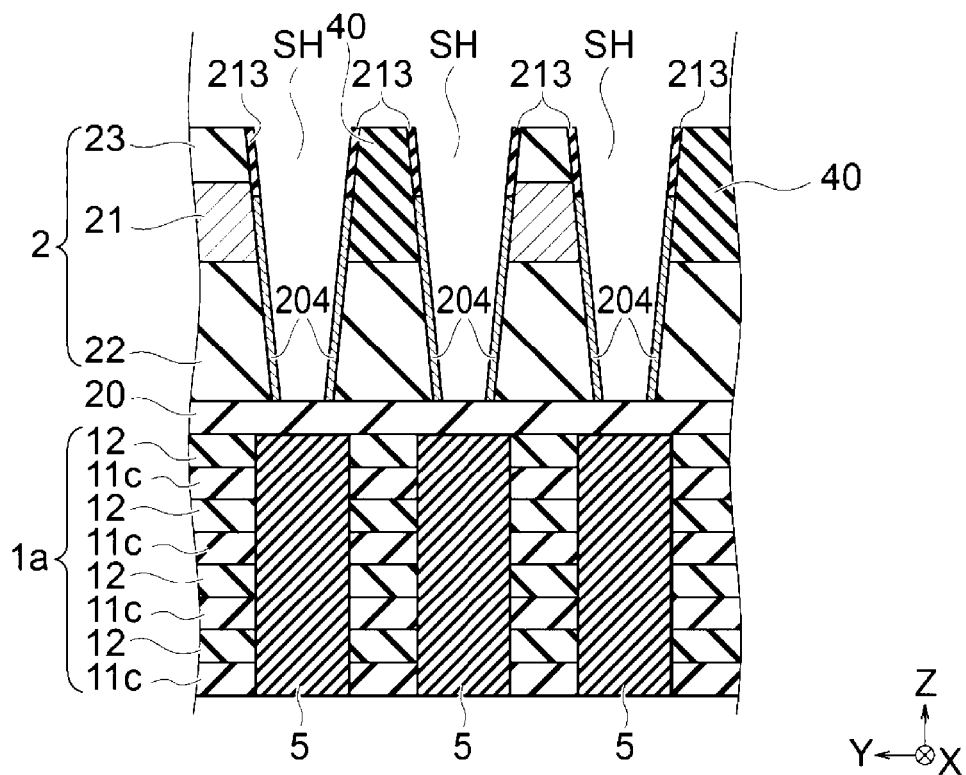
FIG. 12A illustrates a cross-sectional view related to manufacturing processes of a semiconductor storage device according to a first embodiment.
Figure 12B:
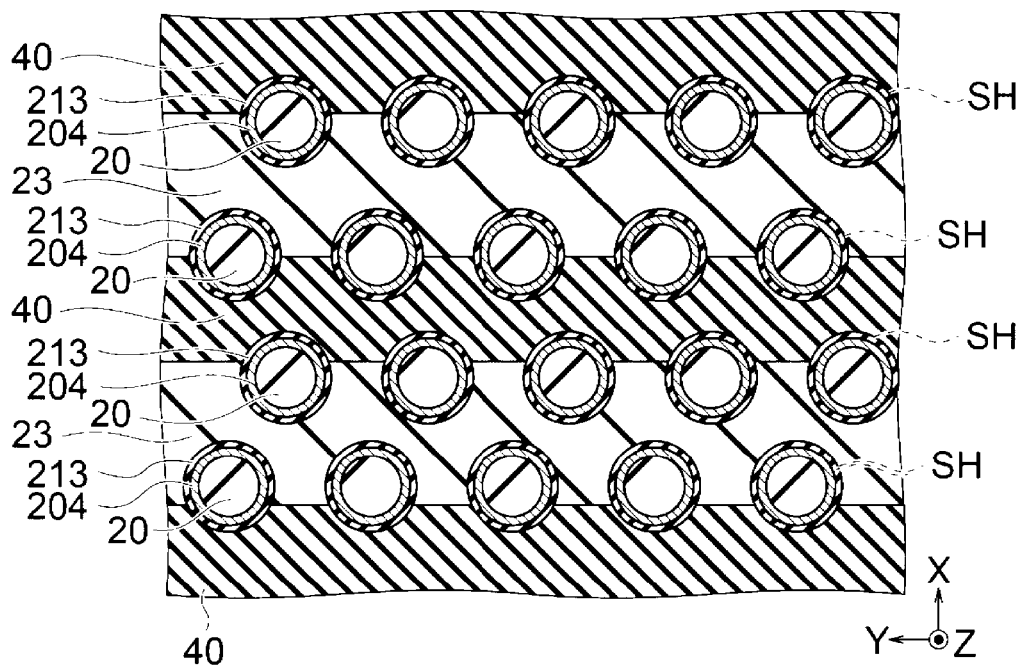
FIG. 12B illustrates a plan view corresponding to FIG. 12A.

Next, the material of an insulating film 213 is deposited on the side surface portion of the third insulating film 23 as the inner wall of the hole SH (FIGS. 11A and 11B). For example, a silicon oxide film is used as the material of the insulating film 213. When side etching occurs in the previous step, the material of this insulating film 213 is deposited so as to be embedded in a portion where side etching occurs. Thus, the leakage current from the third semiconductor portion 202A and the fourth semiconductor portion 202B to the wiring layer 21 due to the portion where side etching occurs is prevented.

Figure 13A:
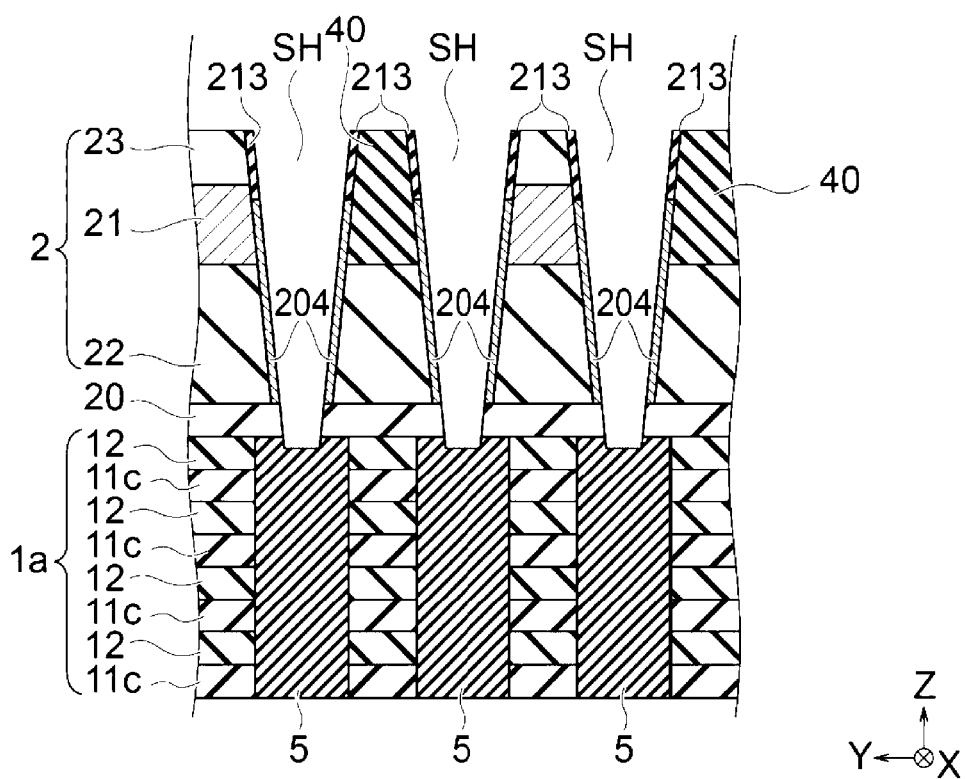
FIG. 13A illustrates a cross-sectional view related to manufacturing processes of a semiconductor storage device according to a first embodiment.
Figure 13B:
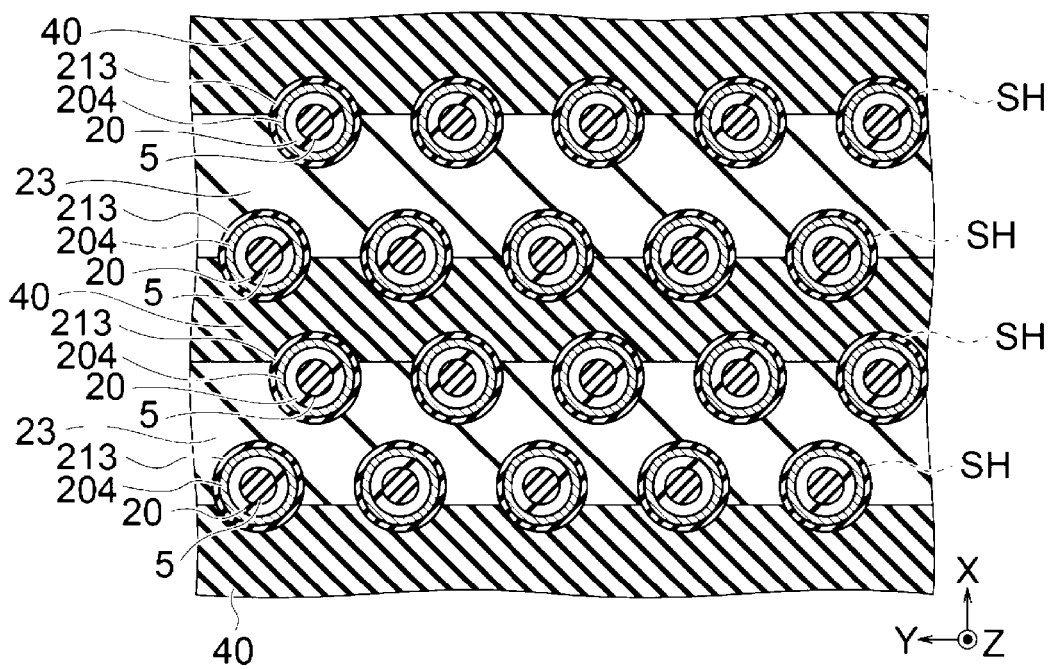
FIG. 13B illustrates a plan view corresponding to FIG. 12A.

Next, the second sacrificial layer 6 is removed by the asher. Furthermore, the material of the gate electrode film 204 deposited on the bottom surface of the hole SH and on the interlayer insulating film 20 is removed (FIGS. 12A and 12B), and the hole SH is formed so as to penetrate the interlayer insulating film 20 and reach the first sacrificial layer 5 (FIGS. 13A and 13B). This step is carried out such that the gate electrode film 204 deposited on the side wall of the hole SH is not removed.

Figure 14:
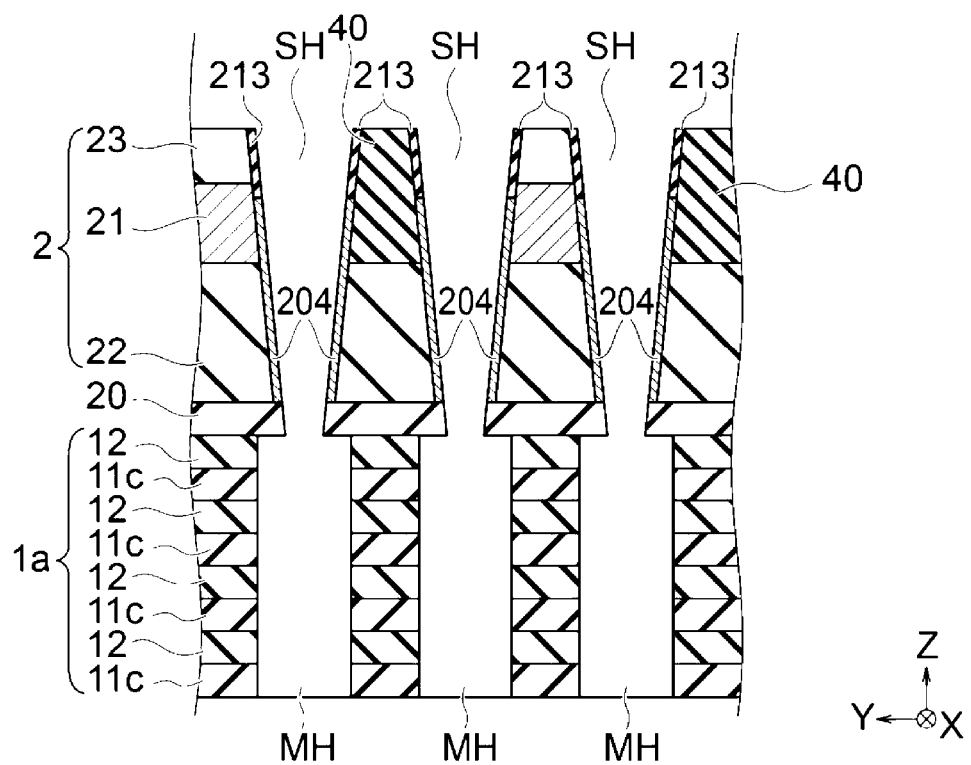
FIG. 14 illustrates a cross-sectional view of the structure to illustrate a process of the method of manufacturing the semiconductor storage device according to the first embodiment, which follows the one in FIG. 13A.

Next, the first sacrificial layer 5 is removed with the asher. Thus, the hole SH and the memory hole MH communicate with each other (FIG. 14). That is, a through-hole communicates the first stacked body 1a and the second stacked body 2 with each other.

Figure 15:
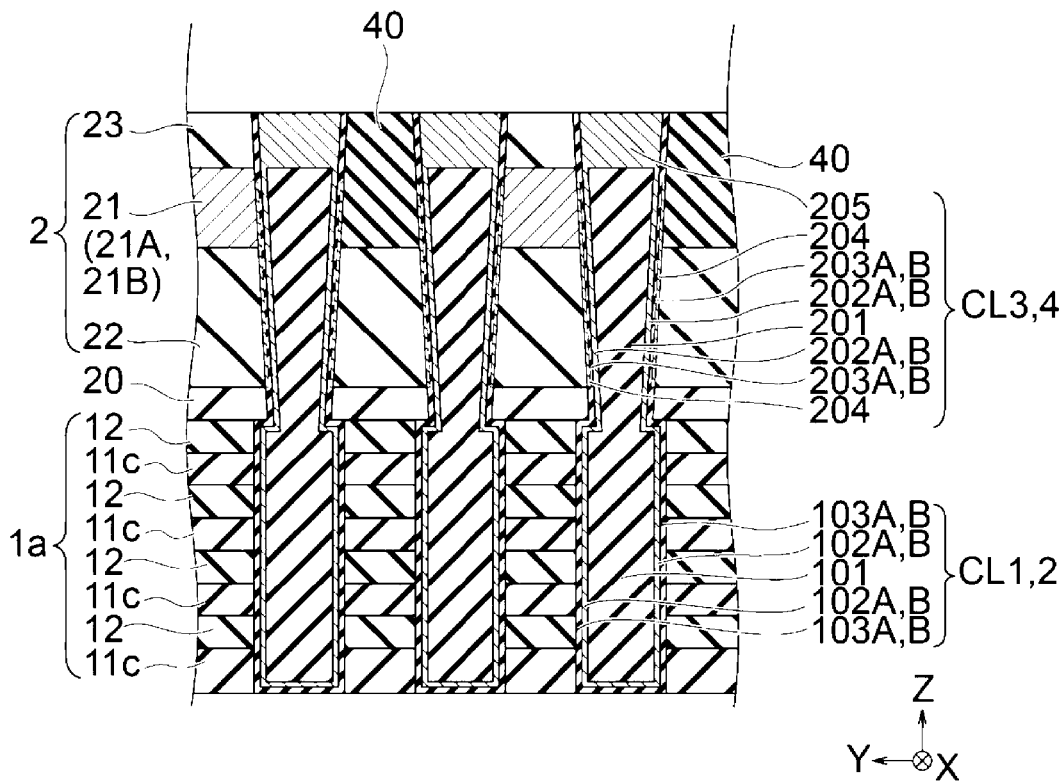
FIGS. 15 to 18C illustrate cross-sectional views related to manufacturing processes of a semiconductor storage device according to a first embodiment.

Next, as illustrated in FIG. 15, the material of the fourth insulator 203A and the fifth insulator 203B is deposited on the inner wall of the communication through-hole of the hole SH and the memory hole MH. The material of the fourth insulator 203A and the fifth insulator 203B functions as the first insulator 103A and the second insulator 103B in the memory hole MH. In other words, the fourth insulator 203A may be continuous with and have the same material as the first insulator 103A in the first stacked body 1a, and the fifth insulator 203B may be continuous with and have the same material as the second insulator 103B. The fourth insulator 203A and the fifth insulator 203B as well as the first insulator 103A and the second insulator 103B may include, for example, a stacked film (ONO film) in which a silicon oxide film, a silicon nitride film, and a silicon oxide film are stacked.

Next, the material of the third semiconductor portion 202A and the fourth semiconductor portion 202B is deposited on the upper surface of the material of the fourth insulator 203A and the fifth insulator 203B in the hole SH and the memory hole MH. The material of the third semiconductor portion 202A and the fourth semiconductor portion 202B functions as the first semiconductor portion 102A and the second semiconductor portion 102B in the memory hole MH. The first semiconductor portion 102A and the second semiconductor portion 102B function as a memory cell channel in the first stacked body 1a. The third semiconductor portion 202A and the fourth semiconductor portion 202B function as a channel portion of the drain-side select transistor SGD. In this way, the third semiconductor portion 202A may be continuous with and have the same material as the first semiconductor portion 102A in the first stacked body 1a, and the fourth semiconductor portion 202B may be continuous with and have the same material as the second semiconductor portion 102B. The third semiconductor portion 202A and the fourth semiconductor portion 202B as well as the first semiconductor portion 102A and the second semiconductor portion 102B contain silicon. The silicon may be, for example, polysilicon obtained by crystallizing amorphous silicon. The third semiconductor portion 202A and the fourth semiconductor portion 202B as well as the first semiconductor portion 102A and the second semiconductor portion 102B are, for example, undoped silicon, and may be p-type silicon.

Next, the remaining space which is the communication through-hole of the hole SH and the memory hole MH is filled with the material of the second insulator column 201. Furthermore, the second insulator column 201 in the upper portion of the hole SH is subjected to etching back. The height of the second insulator column 201 may be substantially the same as the height of the upper surface of the wiring layer 21 of the second stacked body 2. The material of the second insulator column 201 functions as the first insulator column 101 in the memory hole MH. The second insulator column 201 may be continuous with and be made of the same material as the first insulator column 101 in the first stacked body 1a. For the second insulator column 201 and the first insulator column 101, for example, an insulating material containing silicon oxide is used. When the third semiconductor portion 202A and the fourth semiconductor portion 202B, or the fourth insulator 203A and the fifth insulator 203B remain on the upper surface of the second stacked body 2 in the region other than the hole SH, they are removed by etching back.

As described above, the first columnar body CL1 and the second columnar body CL2 are provided in the first stacked body 1a portion, and the third columnar body CL3 and the fourth columnar body CL4 are provided in the second stacked body 2 portion.

Next, the cap silicon layer 205 is deposited on the upper surface of the second insulator column 201 which is filled by the above step in the through-hole in the upper portion of the hole SH. The cap silicon layer 205 is deposited so as to be connected to the third semiconductor portion 202A and the fourth semiconductor portion 202B. The cap silicon layer 205 may be, for example, n-type silicon. The cap silicon layer 205 is electrically connected to the third semiconductor portion 202A and the fourth semiconductor portion 202B. The cap silicon layer 205 on the upper surface of the second stacked body 2 is removed by etching back in the region other than the hole SH.

Figure 16:
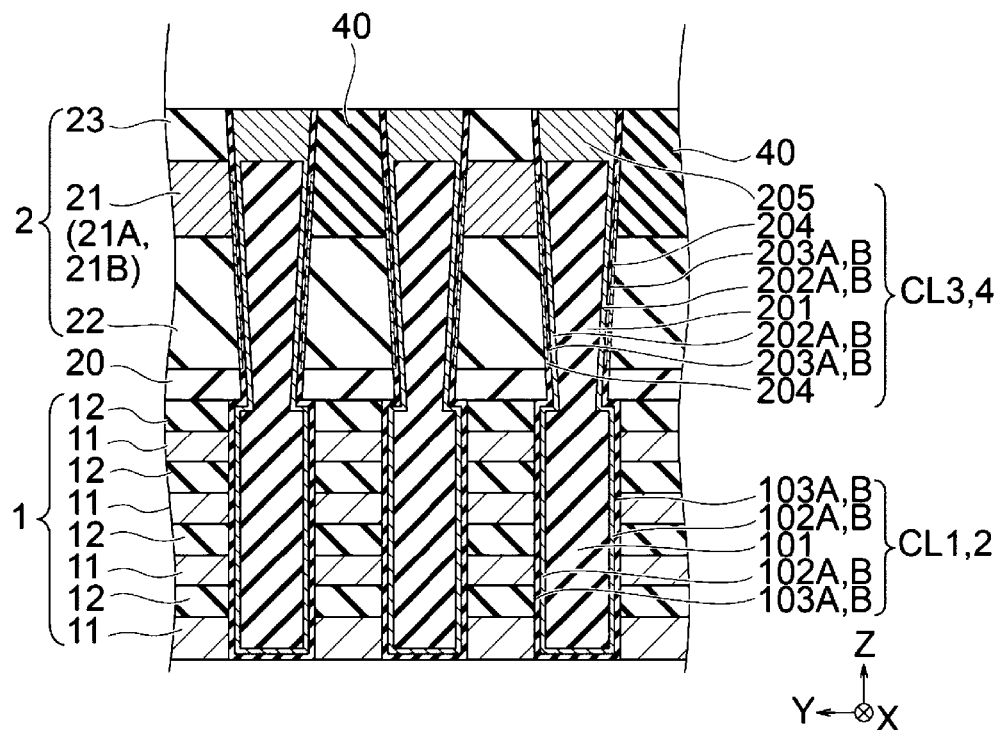

Next, the deep slit ST is formed to penetrate the first stacked body 1a and the second stacked body 2 and reach the base portion 3 by using a lithography technique and an RIE method. Next, the plurality of material films 11c of the first stacked body 1a are removed through the deep slit ST to form a plurality of spaces between the first insulating films 12. Then, a replacement step of embedding the first conductive films 11 in the spaces is performed (FIG. 16). The first conductive films 11 are made of conductive metal and contain, for example, tungsten.

By the above replacement step, the plurality of memory cells MC are formed at the intersections of the first conductive film 11 with the first columnar body CL1 and the second columnar body CL2. Then, the first insulator 103A and the second insulator 103B function as the charge capture film 103b of FIGS. 2A and 2B. The charge capture film 103b may be, for example, a stacked (multi-layer) film in which a silicon oxide film, a silicon nitride film, and a silicon oxide film are stacked.

Next, the wiring structures 51 and 52 are provided above the cap silicon layer 205 of the third columnar body CL3 and fourth columnar body CL4 adjacent to each other. For example, the wiring structure 51 may be made of a conductive material such as titanium (Ti), titanium nitride (TiN), or tungsten (W), and the wiring structure 52 may be made of a conductive substance such as TiN or W.

Figure 17A:
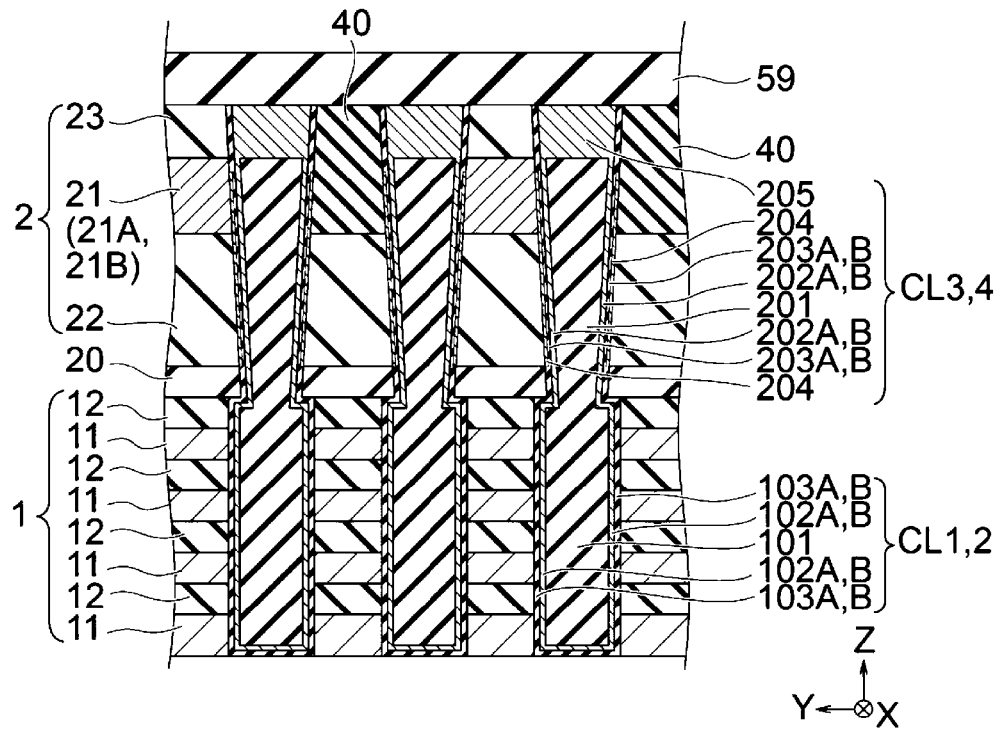
Figure 17B:
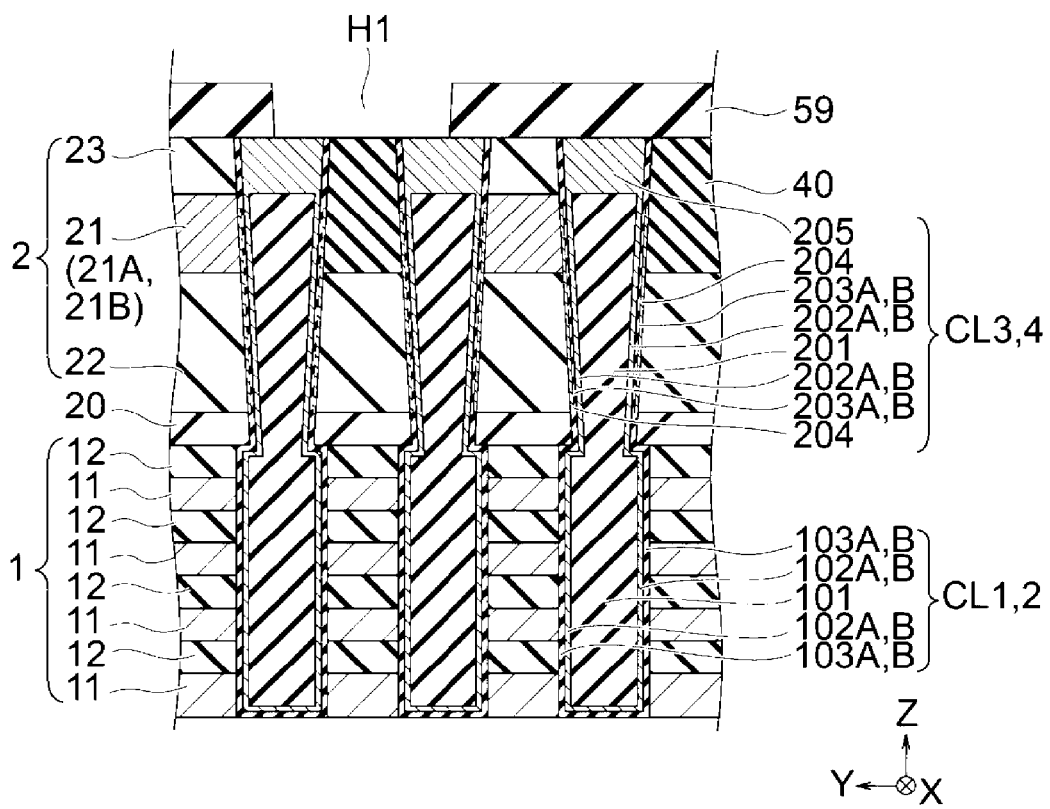
Figure 17C:
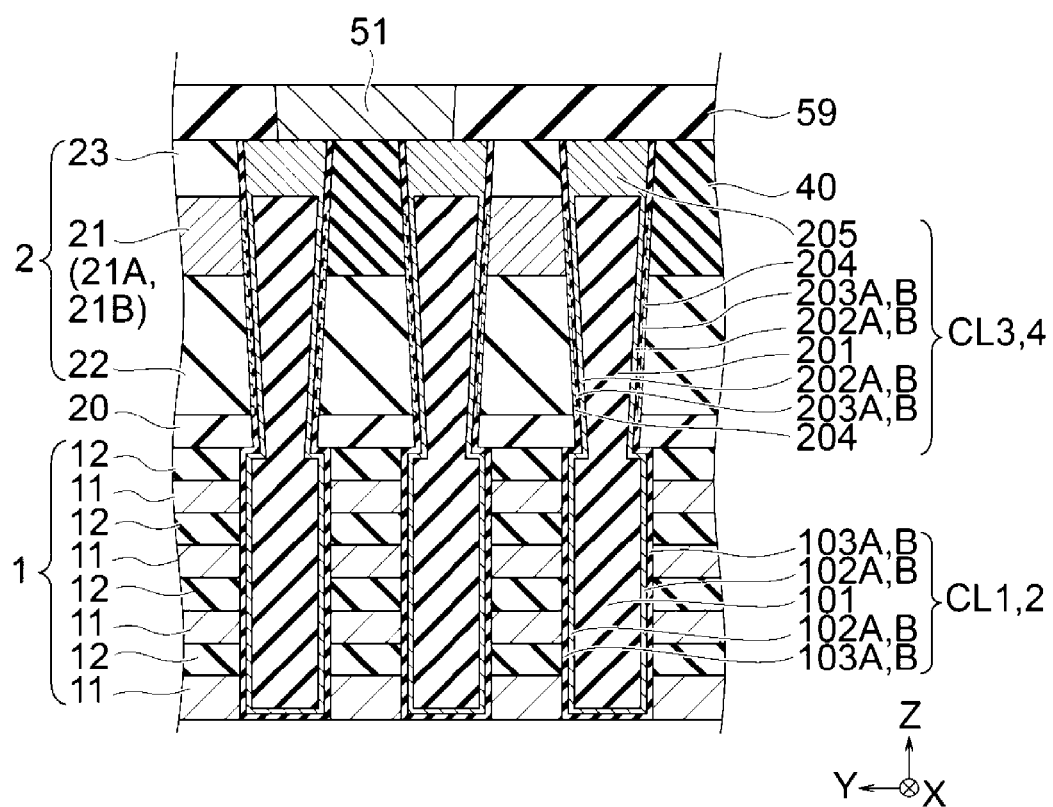

The manufacture of the wiring structures 51 and 52 will be described below. First, as illustrated in FIG. 17A, an interlayer insulating film 59 is formed on the upper surface of the second stacked body 2. Next, as illustrated in FIG. 17B, a hole H1 is formed by etching a portion which is to form the wiring structure 51 above the third columnar body CL3 and the fourth columnar body CL4 which are adjacent to each other with the third insulator 40 sandwiched therebetween. The hole H1 may be formed to a depth by which it reaches the upper surface of the cap silicon layer 205 of the third columnar body CL3 and the fourth columnar body CL4, and may be formed in a substantially elliptical shape in the plan view as viewed from the first direction. Next, as illustrated in FIG. 17C, the hole H1 is filled with Ti, TiN or W, and the upper surface thereof is subjected to chemical mechanical polishing (CMP) to form the wiring structure 51.

Figure 18A:
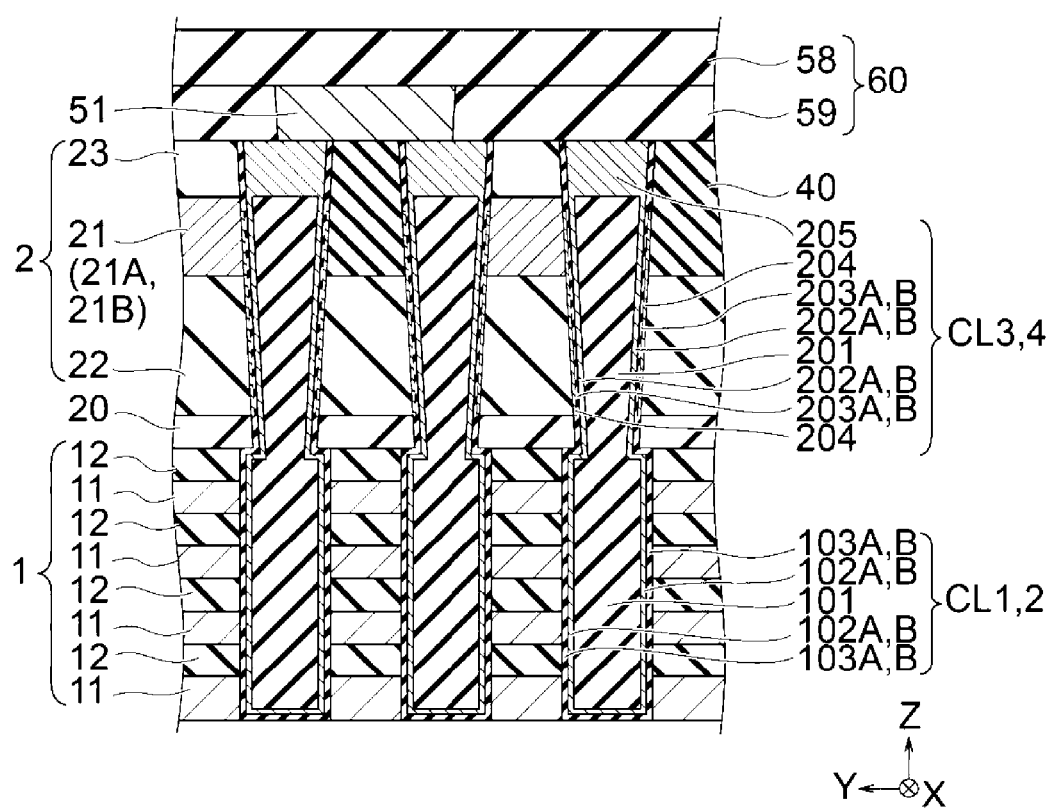
Figure 18B:
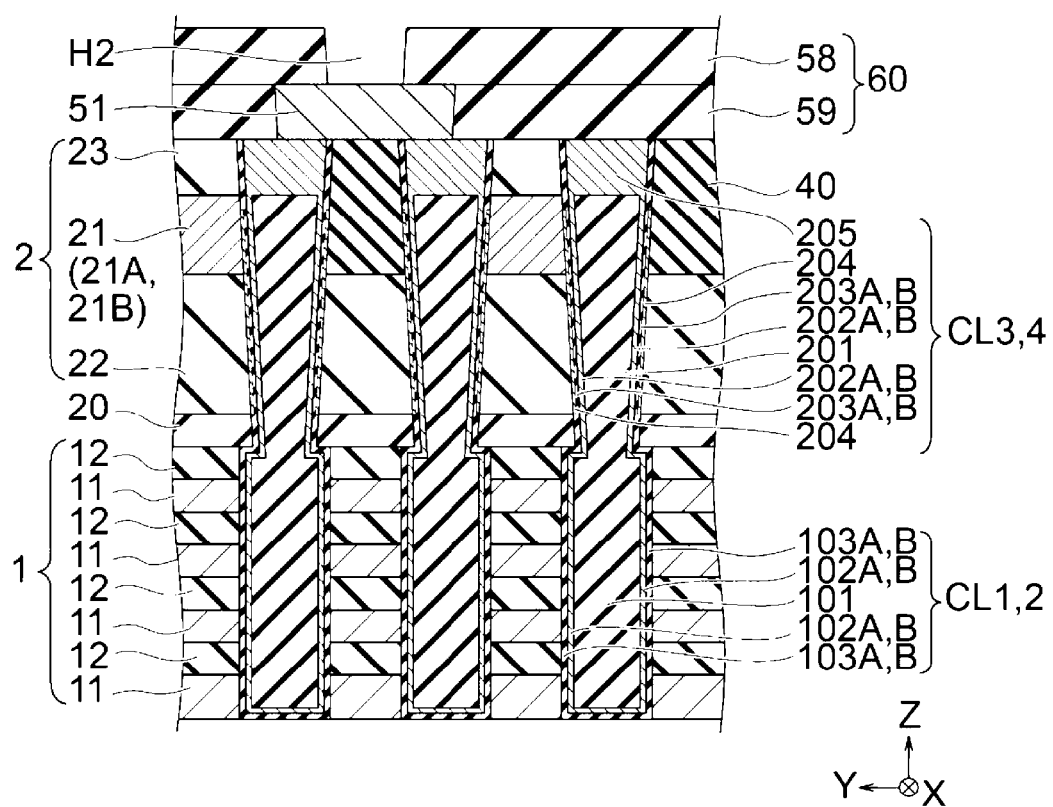
Figure 18C:
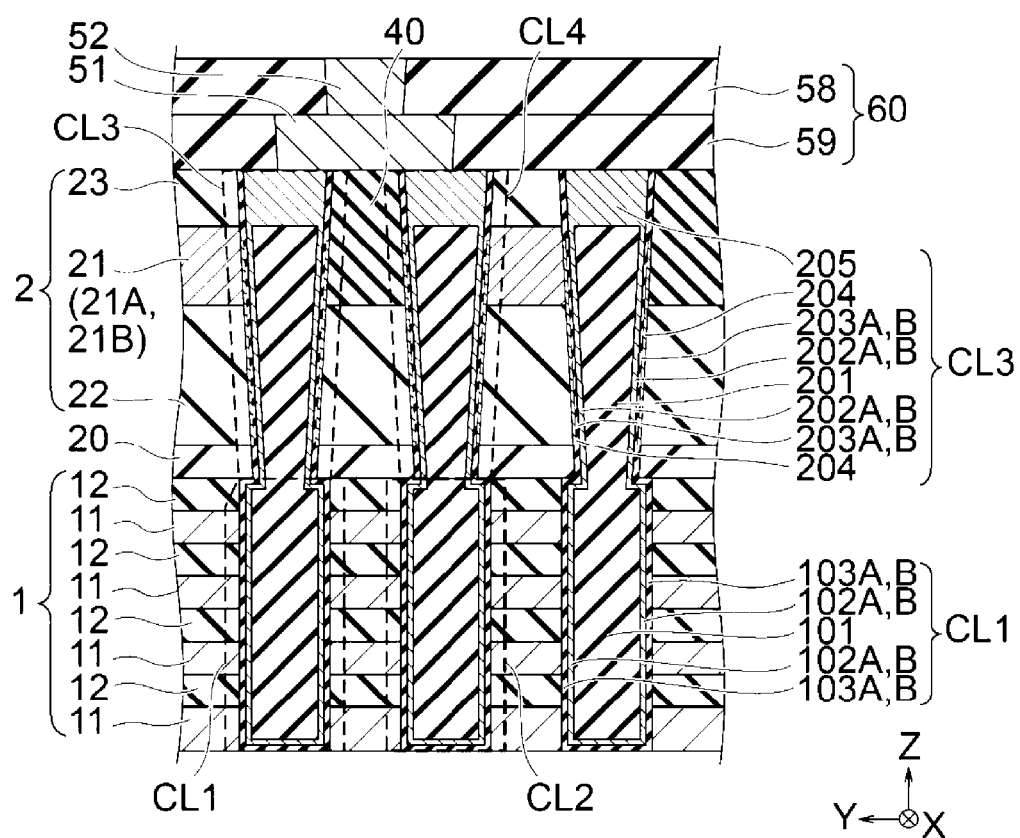

Next, as illustrated in FIG. 18A, an interlayer insulating film 58 is formed on the upper surface of the interlayer insulating film 59. Next, as illustrated in FIG. 18B, a portion which is to form the wiring structure 52 above the wiring structure 51 is etched to form a hole H2. The hole H2 may be formed to a depth by which it reaches the upper surface of the wiring structure 51, and may be formed in a substantially elliptical shape in the plan view as viewed from the first direction. The hole H2 is formed to have a smaller planar area than the planar area of the hole H1 described above. Next, as illustrated in FIG. 18C, the hole H2 is filled with TiN or W, and the upper surface thereof is subjected to CMP to form the wiring structure 52.

The interlayer insulating film 58 and the interlayer insulating film 59 may be made of the same material, and may be, for example, a silicon oxide film.

The semiconductor storage device 100 illustrated in FIGS. 3A and 3B are manufactured through the above-described steps.

As described above, with the manufacturing method of the semiconductor storage device 100 according to the present embodiment, the gate electrode film 204 may be formed so as to be thicker than the wiring layer 21 (the second conductive film 21A and the third conductive film 21B) in the channel longitudinal direction. That is, the thickness of the gate electrode film 204 in the channel longitudinal direction (substantially in the first direction) is thicker than the thickness of the wiring layer 21 in the channel longitudinal direction (substantially in the first direction). Thus, the cutoff characteristic of a select gate transistor may be improved.

In addition, the gate electrode film 204 is provided over the entire circumference of the third semiconductor portion 202A and the fourth semiconductor portion 202B. Thus, the drain-side select gate SGD portion for allowing the flow of cell current may be secured over the entire circumference of the third semiconductor portion 202A and the fourth semiconductor portion 202B, and similarly, the cutoff characteristic of the select gate transistor may be improved. That is, the occurrence of off-leakage of the drain-side select gate SGD may be prevented.

Furthermore, the wiring structure 51 above the cap silicon layer 205 provided above two adjacent third and fourth columnar bodies CL3 and CL4 is formed so as to be bridged to each second columnar body CL2, and the wiring structure 52 is provided above the wiring structure 51. Therefore, the adjacent third and fourth columnar bodies CL3 and CL4 may be electrically connected, and the required number of wiring structures 52 may be reduced to about half the number of arranged third and fourth columnar bodies CL3 and CL4. This makes the manufacturing process of the semiconductor storage device 100 according to the present embodiment be more efficient.

Further, in the present embodiment, when the second stacked body 2 is formed, the wiring layer 21 (for example, tungsten (W)) having conductivity is stacked in advance between the second insulating film 22 and the third insulating film 23. Therefore, in the second stacked body 2, the replacement step of replacing the sacrificial layer with the wiring layer 21 may be omitted. Accordingly, the manufacturing step of the semiconductor storage device 100 may be shortened, and the generation of voids in the wiring layer 21 may be prevented. Further, since the wiring layer 21 having a certain thickness may be stacked in advance, it is easy to adjust the thickness of the wiring layer 21.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
    a plurality of word lines spaced from each other in a thickness direction;
    a first memory string including a plurality of first memory transistors connected in series, gates of the first memory transistors being connected to the word lines, respectively;
    a second memory string including a plurality of second memory transistors connected in series, gates of the second memory transistors being connected to the word lines, respectively;
    a first select gate line above the plurality of word lines in the thickness direction;
    a first select gate transistor connected in series to the first memory string, a gate of the first select gate transistor being connected to the first select gate line;
    a second select gate line above the plurality of word lines in the thickness direction; and
    a second select gate transistor connected in series to the second memory string, a gate of the second select gate transistor being connected to the second select gate line, wherein
    a channel length of the first select gate transistor is greater than a thickness of the first select gate line in the thickness direction.

2. The semiconductor storage device according to claim 1, wherein a channel length of the second select gate transistor is greater than a thickness of the second select gate line in the thickness direction.

3. The semiconductor storage device according to claim 1, further comprising:
    a bit line electrically connected to the first select gate transistor and the second select gate transistor.

4. The semiconductor storage device according to claim 1, wherein
    a length of the gate of the first select gate transistor in the first direction is greater than the thickness of the first select gate line in the thickness direction, and a length of the gate of the second select gate transistor in the first direction is greater than the thickness of the second select gate line in the thickness direction.

5. The semiconductor storage device according to claim 1, wherein the channel length of the first select gate transistor is equal to the channel length of the second select gate transistor.

6. The semiconductor storage device according to claim 1, wherein the channel length of the first select gate transistor is greater than twice the thickness of the first select gate line in the thickness direction.

* * * * *